United States Patent [19]

Kanai et al.

[11] Patent Number: 4,800,173

[45] Date of Patent: Jan. 24, 1989

[54] PROCESS FOR PREPARING SI OR GE EPITAXIAL FILM USING FLUORINE OXIDANT

[75] Inventors: Masahiro Kanai; Junichi Hanna; Isamu Shimizu, all of Tokyo, Japan

[73] Assignee: Canon Kabushiki Kaisha, Tokyo, Japan

[21] Appl. No.: 15,951

[22] Filed: Feb. 18, 1987

[30] Foreign Application Priority Data

Feb. 20, 1986 [JP] Japan ................... 61-33925
Feb. 20, 1986 [JP] Japan ................... 61-33926
Feb. 27, 1986 [JP] Japan ................... 61-40334

[51] Int. Cl.$^4$ ......................................... H01L 21/205
[52] U.S. Cl. ................... 37/081; 148/DIG. 48; 148/DIG. 57; 148/DIG. 58; 148/DIG. 93; 156/613; 437/082; 437/173; 437/942; 437/963; 437/88
[58] Field of Search ............... 118/50.1; 148/DIG. 41, 148/48, 79, 93, 110, 169; 156/611-615; 427/35, 42, 53.1, 54.1; 437/88, 101, 103, 104, 106, 107, 942

[56] References Cited

U.S. PATENT DOCUMENTS

| | | | |
|---|---|---|---|
| Re. 31,708 | 10/1984 | Gordon | 427/126.2/ |
| 3,306,768 | 2/1967 | Peterson | 117/106 |
| 3,473,978 | 10/1969 | Jackson et al. | 437/93 |
| 3,661,637 | 5/1972 | Sirtl | 437/103 |
| 3,888,705 | 6/1975 | Fletcher et al. | 437/107 |
| 4,138,509 | 2/1979 | Ingle et al. | 156/613 |
| 4,146,657 | 3/1979 | Gordon | 427/126 |
| 4,239,911 | 12/1980 | Kemlage | 437/238 |
| 4,357,179 | 11/1982 | Adams et al. | 437/19 |
| 4,397,833 | 8/1983 | Sugata et al. | 430/84 |
| 4,402,762 | 9/1983 | John et al. | 437/16 |
| 4,421,592 | 12/1983 | Shuskus et al. | 156/613 |
| 4,448,801 | 5/1984 | Fukuda et al. | 427/53.1 |
| 4,454,835 | 6/1984 | Walsh et al. | 118/50.1 |
| 4,462,847 | 7/1984 | Thompson et al. | 437/99 |
| 4,501,777 | 2/1985 | Rose | 427/255 |
| 4,504,518 | 3/1985 | Ovshinsky et al. | 427/38 |
| 4,510,177 | 4/1985 | Furumura et al. | 156/613 |
| 4,522,663 | 6/1985 | Ovshinsky et al. | 148/403 |
| 4,532,199 | 7/1985 | Ueno et al. | 430/128 |
| 4,554,180 | 11/1985 | Hirooka | 427/248.1 |
| 4,569,855 | 2/1986 | Matsuda et al. | 427/53.1 |
| 4,609,562 | 9/1986 | Isenberg et al. | 427/8 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/255.2 |
| 4,652,463 | 3/1987 | Peters | 427/58.1 |
| 4,657,777 | 4/1987 | Hirooka | 427/39 |
| 4,683,144 | 7/1987 | Nishimura et al. | 427/35 |
| 4,683,145 | 7/1987 | Nishimura et al. | 427/54.1 |
| 4,683,146 | 7/1987 | Hirai et al. | 427/35 |
| 4,683,147 | 7/1987 | Eguchi et al. | 427/54.1 |
| 4,689,093 | 8/1987 | Ishihara et al. | 437/5 |

FOREIGN PATENT DOCUMENTS

| | | |
|---|---|---|
| 74212 | 3/1983 | European Pat. Off. . |
| 90586A | 10/1983 | European Pat. Off. . |
| 59-199035 | 12/1984 | Japan . |
| 60-43819 | 8/1985 | Japan . |
| 2038086A | 7/1980 | United Kingdom . |
| 2148328A | 5/1985 | United Kingdom . |

OTHER PUBLICATIONS

Brodsky et al., 22 IBM Technical Disclosure Bulletin 3391 (Jan. 1980), vol. 22.

(List continued on next page.)

Primary Examiner—Brian E. Hearn
Assistant Examiner—William Bunch
Attorney, Agent, or Firm—Fitzpatrick, Cella, Harper & Scinto

[57] ABSTRACT

Process for producing a valence electron controlled functional crystalline film by introducing (i) a film forming gaseous raw material, (ii) a halogen series gaseous oxidizing agent to oxidize the raw material (i), and (iii) a gaseous raw material to impart a valence electron controlling agent separtely into a reaction region of a film deposition space and chemically reacting them to generate plural kinds of precursors containing excited precursors and to let at least one kind of said precursors to act as a film forming supplier whereby said crystalline film is formed on a selected substrate being kept at a predetermined temperature in the film deposition space.

18 Claims, 3 Drawing Sheets

OTHER PUBLICATIONS

Inoue, Appl. Phys. Lett. 43(8), 15 Oct. 83, p. 774.
Ohnishi et al., Proceedings, 6th E. C. Photovoltaic Solar Energy Conference, London, Apr. 15–19, 1985, pp. 677–681.
Sakai et al., Proceedings, 6th E. C. Photovoltaic Solar Energy Conference, London, Apr. 15–19, 1985, pp. 687–686.
Matsumura et al., Abstract, 18th IEEE Conf. 0/1985.
Matsumura et al.; Conf. Record, 18th IEEE Conf. 4-2-8-86, pp. 1277–1282.

PROCESS FOR PREPARING SI OR GE EPITAXIAL FILM USING FLUORINE OXIDANT

FIELD OF THE INVENTION

This invention relates to an improved process for producing functional crystalline films. More particularly, it relates to an improved process for producing functional epitaxial films and polycrystalline films for use in electronic devices such as semiconductor devices, photosensor devices for image input apparatus, photosensitive devices for use in electrophotography etc.

BACKGROUND OF THE INVENTION

For the production of a functional film, especially a crystalline semiconductor film, an appropriate method has been employed in view of the required characteristics, use purpose or the like for the film to be obtained.

That is, there have been proposed various methods using vacuum evaporation technique, thermal induced chemical vapor deposition technique, plasma chemical vapor deposition technique, reactive sputtering technique, ion plating technique and light induced chemical vapor deposition technique.

Among those methods, the method of thermal induced chemical vapor deposition (hereinafter referred to as "CVD method") had once been frequently used in various applications. However, such methods are not usually employed for the reason that, besides requiring an elevated temperature, a practically usable film cannot be obtained as expected.

On the other hand, the plasma chemical vapor deposition method (hereinafter referred to as "plasma CVD method") has been generally evaluated as being the most preferred and is currently used to prepare a deposited film on a commercial basis.

Now, although the plasma CVD method is widely used nowadays as above mentioned, that method is problematical due to the fact that it is practiced under elevated temperature conditions and other problems are associated with the apparatus to be used.

Regarding the former problems, because the plasma CVD method is practiced while maintaining substrate at an elevated temperature, firstly the kind of a substrate to be used is limited to one that does not contain a material such as a heavy metal which can migrate and cause changes in the characteristics of a deposited film to be formed and secondly, its thickness is likely to be varied, whereby the resulting film lacks uniformity of thickness and homogeneity of the composition, which may itself also cause changes in the characteristics of the film to be formed.

Regarding the latter problems, the operating conditions employed with the plasma CVD method are much more complicated than the known CVD method, and are extremely difficult to be generalized.

That is, there already exist a number of variations even in the correlated parameters of substrate temperature, the amount and the flow rate of gases to be introduced, the pressure, the high frequency power for forming a film the structure of the electrodes, the structure of the reaction chamber, the exhaust rate, the plasma generation system, etc. Under these circumstances, in order to prepare a desirable functional deposited film for electron devices, it is required to choose precise parameters from a great number of varied parameters.

There sometimes occurs a serious problem that because of the precisely chosen parameters, the plasma may attain an unstable state which often imparts unexpected troublesome effects to functional deposited film to be formed.

In addition, in the case of desiring to form a crystalline functional deposited film, stably producing such film in accordance with the plasma CVD method is considered to be difficult since the related conditions to make a film to be crystalline are extremely limited under the plasma CVD method.

Further, in recent years, the public attention has been forcused on functional crystalline films such as functional epitaxial films and functional polycrystalline films constituted with atoms of Groups IIB and VIA or atoms of Groups IIIA and VA of the Periodic Table because of their wide usefulness.

For their production, there have been proposed various methods which can be classified into two categories of vapor phase epitaxy and liquid phase epitaxy.

The liquid phase epitaxy is a method of depositing a semiconductor crystal on a selected substrate by resolving a raw material for semiconductor in a metallic solvent in liquid state at elevated temperature until the raw material becomes supersaturated, and cooling the solution.

For this method, there is an advantage that such a crystalline product as having a relevant completeness can be obtained since it is prepared in the state of being most closest to thermal equilibrium among various epitaxy techniques. However, there are unavoidable disadvantages, particularly, in the case of preparing optical devices for which an epitaxial layer having a thin and uniform thickness is required to be used. That is, the yield in its preparation is unsatisfactory and undesirable influences occur because of poor mass productivity and unstable surface state for the film to be formed.

In view of the above, the liquid phase epitaxy is nowadays seldom used.

On the other hand, as for the vapor phase epitaxy, it has been often tried to practice it using physical methods such as vacuum evaporation and reactive sputtering, and chemical methods such as hydrogen reduction and thermal cracking using organometallic compounds or metal hydrides. Among these methods, the molecular beam epitaxy, a kind of the vacuum evaporation deposition, is a dry process practiced under ultra-high vacuum. Therefore, there are advantages for said epitaxy in that it is possible to make a product highly purified and to deposit a film at low temperature, and a relatively plane deposited film can be obtained. However, even for such epitaxy, there are disadvantages which remain unresolved in that surface defect density is large, a practically applicable method for controlling the directivity of the molecular beam is yet to be practically developed, production of a large square deposited film is difficult, and mass productivity is insufficient. In addition these disadvantages, an apparatus for practicing such epitaxy is too costly.

In view of the above, the molecular beam epitaxy is not yet practiced on an industrial scale.

As for said hydrogen reduction method and thermal cracking method, they are generally called halide CVD method, hydride CVD method and MO-CVD method. These methods are generally evaluated as being worthy of being discussed since there are advantages that a film forming apparatus therefor can be relatively easily manufactured and, highly purified metal halides, metal hydrides and organometals which are used as raw materials in such methods are generally available.

However, under these methods, since the temperature of a substrate is required to be high enough to allow the occurrence of the reduction reaction or thermal cracking, there is a limit for the kind of the substrate which can be used. In addition, in the case where the raw material is not sufficiently decomposed, contaminations with the impurities such as carbon atoms, halogen atoms are apt to occur and as a result, it becomes difficult to control the degree of doping.

Under this circumstance, even if a desirable functional crystalline film should be fortunately produced, the functional crystalline film product will become costly for the reasons that a heavy investment is necessitated to set up a particularly appropriate apparatus therefor.

In this regard, for mass-producing a desirable functional crystalline deposited film, particularly, a functional silicon-containing or germanium-containing epitaxial film, it is desired to modify or change the currently known methods to such that makes one possible to effectively form such film.

In fact, there is now an increased demand for providing a method that makes it possible to practice the process at lower temperature and at a high film forming rate in a simple apparatus to mass-produce a desirable functional epitaxial film applicable in any electron devices which has satisfactory uniformity and has practically applicable characteristics.

SUMMARY OF THE INVENTION

The present inventors have conducted extensive studies in order to solve the problems in the aforementioned known methods and in order to develop a new process for effectively and simply preparing functional crystalline films such as functional epitaxial films and functional polycrystalline films. As a result, the present inventors have finally found an effective method that enables efficient and stable production of not only a desirable functional epitaxial film but also a functional polycrystalline film which are widely usable in the preparation of various electron devices according to the simplified procedures as detailed below.

It is therefore an object of this invention to provide improved high quality epitaxial film and polycrystalline film which have desirable and practically applicable electric, optical and semi-conductive characteristics and which are effectively usable in various electron devices such as semiconductor device, image input line sensor, image pickup device, photsensitive device for use in electrophotography and the like.

Another object of this invention is to provide a new process for preparing the above crystalline films by which simplification of the film forming conditions therefor, enlargement of the areas, improvement of the productivity and the mass-production can be accomplished while maintaining the characteristics of the film to be formed and promoting the deposition rate, the repeatability and the uniformity in quality.

DESCRIPTION OF THE INVENTION

Figure 1:
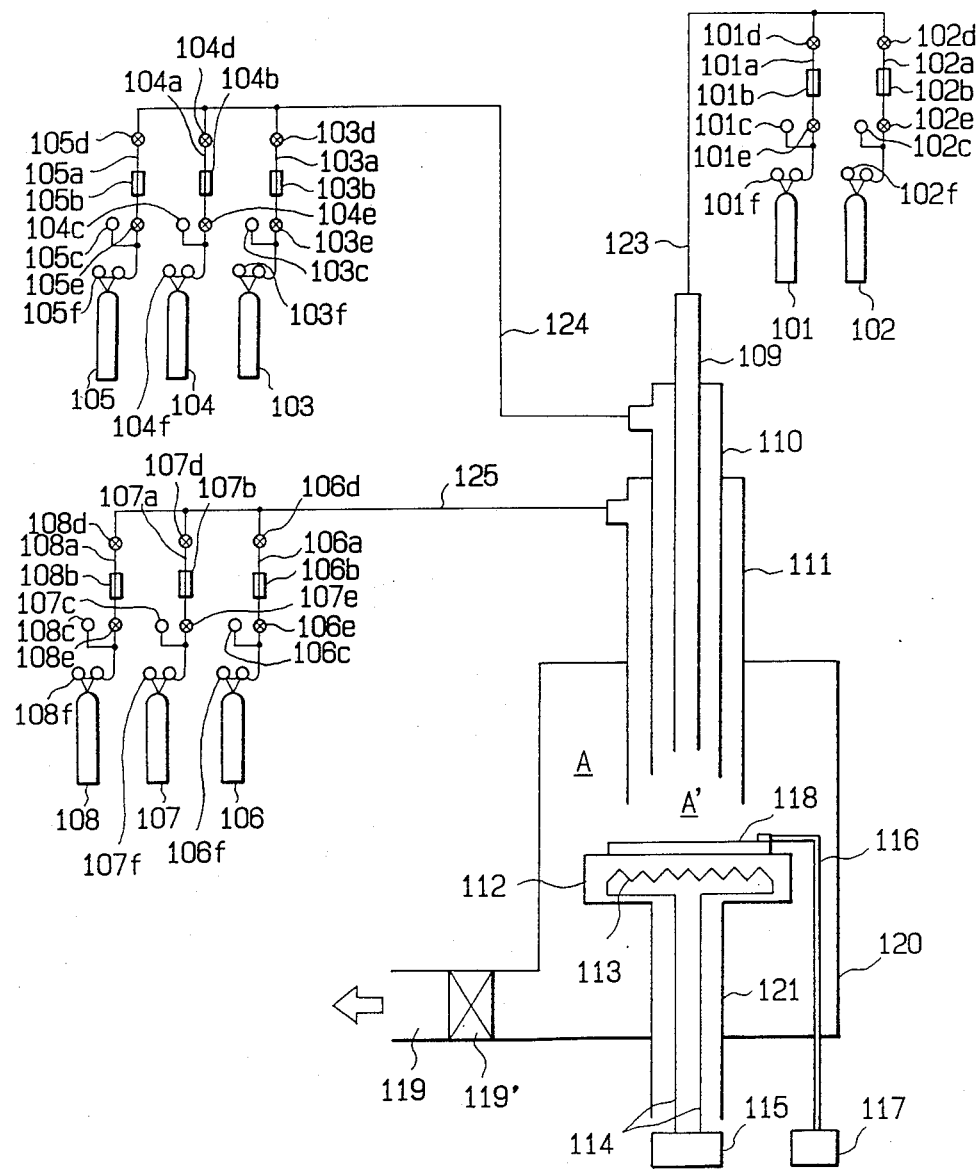
FIG. 1 is a schematic view illustrating a representative apparatus for practicing the process according to this invention.

This invention provides a effective process aiming at accomplishment of simplification of the film forming conditions for the preparation of a functional epitaxial film and a functional polycrystalline film so as to enable their mass-production while maintaining the characteristics of the film to be formed and promoting the deposition rate at relatively lower temperature in a film deposition space.

According to this invention, a desirable functional expitaxial film on a desirable functional polycrystalline film having a wealth of many desirable electric, optical and semiconductive characteristics, which has an uniform thickness and a desirable homogeneity and which is usable in various electron devices, may be effectively formed at an improved deposition rate without the formed layer peeling off from the substrate, and such that the layer which is formed on the substrate is not affected either by any of the undesirable materials removed from the inner surface of the surrounding wall of the film deposition space or by the residual gases remaining in the film deposition space.

According to the first representative embodiment of this invention, the process according to this invention comprises introducing (i) a film forming gaseous raw material, (ii) a halogen series gaseous oxidizing agent to oxidize the raw material (i), and (iii) a gaseous raw material to impart a valence electron controlling agent separately into a reaction region of a film deposition space and chemically reacting them to generate plural kinds of precursors containing excited precursors and to let at least one kind of said precursors to act as a film forming supplier whereby a valence electron controlled functional epitaxial film or a valence electron controlled functional polycrystalline film is formed on a selected substrate being kept at a predetermined temperature in the film deposition space.

According to the second representative embodiment of this invention, the process according to this invention comprises introducing (i) a film forming gaseous raw material, (ii) halogen series gaseous oxidizing agent to oxidize the raw material (i), and (iii) a gaseous raw material to impart a valence electron controlling agent separately into a reaction region of a film deposition space, starting a chemical reaction among them to generate plural kinds of precursors containing excited precursors and to let at least one kind of said precursors to act as a film forming supplier whereby the film formation on a selected substrate being kept at a predetermined temperature in the film deposition space, and subjecting the film of being formed to an excitation energy supplied internally or externally by way of an excitation energy generating means to thereby form a valence electron controlled functional epitaxial film or a valence electron controlled functional polycrystalline film on the substrate.

According to this invention, there can be obtained a desirable functional epitaxial film or a desirable functional polycrystalline film in a simple process in the absence of a plasma without having any influence of plasma etching or any problem due to abnormal discharge actions since the process does not depend upon the conventional plasma CVD method using a gaseous plasma formed by subjecting the film forming raw material gas to the action of a discharge energy.

In addition, according to this invention, there are provided the following advantages; a desirable functional epitaxial film or a desirable functional polycrystalline film having an uniform thickness and a desirable homogeneity may be effectively formed at an improved film forming rate in simple procedures without consumption of so much energy as in the known methods; the operation parameters for preparing such functional crystalline film can be largely simplified; an improved semiconductor device having such desirable functional crystalline film (layer) or if necessary, of a large square measure may be mass-produced on an industrial scale to thereby reduce the cost of a product; and such a heavy investment as required for the apparatus in the conventional plasma CVD method is not necessitated even in the case of setting up a particularly appropriate apparatus to practice the process of this invention.

Further, according to this invention, there is provided a further advantage, in addition to the above advantages, that a desirable functional epitaxial film or a desirable functional polycrystalline film having no or extremely slight structural defects can be prepared at high film forming rates without raising the temperature of the substrate.

Now, in this invention, the film forming gaseous raw material (i) and the gaseous raw material to impart a valence electron controlling element (ii) are oxidized by the action of the halogen series oxidizing agent (element) (iii) when they are contacted with the halogen series oxidizing agent, and they are appropriately selected depending upon the kind of a film to be formed, the characteristics required for a film to be formed, the ultimate utility of the film and the like.

Any of the film forming raw material (i), the halogen series oxidizing agent (ii) and the raw material to impart a valence electron controlling element (iii) may be such a substance that is in a gaseous state, a liquid state or a solid state at room temperature under atmospheric pressure condition as long as it can be easily made to be in a gaseous state at the time when it is introduced in the film deposition space. In case where it is in a liquid or solid state, it is entrained by bubbling with the use of a carrier gas such as Ar gas, He gas, $N_2$ gas or $H_2$ gas, if necessary while being heated, to generate a gas, and the gas thus generated is introduced into the film deposition space. In that case, the partial pressure and the mixing ratio among those gaseous raw materials are properly determined by regulating the flow rate of the carrier gas to be used or/and the vapor pressures of the film forming raw material gas (i) and the halogen series oxidizing agent gas (ii).

In case where the film forming raw material (i), the raw material (iii) or the halogen series oxidizing agent (ii) is in gaseous state, it may be diluted with an appropriate carrier gas such as Ar gas, He gas, $N_2$ gas or $H_2$ gas in advance then introduced into the film deposition space.

The film forming raw material (i) to be used in this invention is properly selected depending upon the kind of a semiconductor film to be prepared.

In the case of preparing a semiconductor film constituted with silicon atoms or germanium atoms, it can include, for example, chain silane compounds such as straight chain and branched chain silane compounds, cyclic silane compound, chain germane compounds and the like.

Specifically, the straight chain silane compound can include silane compounds of the general formula: $SinH_{2n+2}$ wherein n is an integer of 1 to 8, the branched chain silane compound can include $SiH_3SiH(SiH_3)SiH_2$·

$SiH_3$, the cyclic silane compound can include cyclic silane compounds of the general formula: $SinH_{2n}$ wherein n is an integer of 3 to 6, and the chain germane compound can include chain germane compounds of the general formula: $GemH_{2m+2}$ wherein m is an integer of 1 to 5. When preparing a semiconductor film constituted with atoms of Group IIB and atoms of Group VIA of the Periodic Table, an organometallic compound containing the Group IIB atoms such as alkyl metal compound containing said atoms, and a hydride, halide, or organometallic compound such as alkyl metal compound containing the Group VIA atoms are selectively used.

Specific examples for the compound containing Group IIB atoms are $Zn(CH_3)_2$, $Zn(C_2H_5)_2$, $Zn(OCH_3)_2$, $Zn(OC_2H_5)_2$, $Cd(CH_3)_2$, $Cd(C_2H_5)_2$, $Cd(C_37)_2$, $Cd(C_4H_9)_2$, $Hg(CH_3)_2$, $Hg(C_2H_5)_2$, $Hg(C_6H_5)_2$, $Hg[\equiv CC(C_6H_5)]_2$, etc.

Specific examples for the compound containing the group VIA atoms are NO, $N_2O$, $CO_2$, CO $H_2S$, $SCl_2$, $S_2Cl_2$, $SOCl_2$, $SeH_2$, $SeCl_2$, $Se_2Br_2$, $Se(CH_3)_2$, $Se(C_2H_5)_2$, $TeH_2$, $Te(CH_3)_2$, $Te(C_2H_5)_2$, etc.

In the case of preparing a semiconductor film constituted with atoms of Group IIIA and atoms of Group VA of the Periodic Table, a hydride, halide, organometallic compound such as alkylmetal compound or oxycompound containing such atoms can be selectively used as the film forming raw material (i).

Specific examples for the compound containing Group IIIA atoms are $B_2H_6$, $B_4H_{10}$, $B_5H_9$, $B_5H_{11}$, $B_6H_{10}$, $B_6H_{12}$, Al $(CH_3)_2Cl$, $Al(CH_3)_3$, $Al(OCH_3)_3$, $Al(CH_3)Cl_2$, $Al(O_2H_5)_3$, $Al(OC_2H_5)_3$, $Al(CH_3)Cl_2$, $Al(i-C_4H_9)_3$, $Al(i-C_3H_7)_3$, $Al(C_3H_7)_3$, $Al(OC_4H_9)_3$, $Ga(OCH_3)$, $Ga(OC_2H_5)_3$, $Ga(OC_3H_7)_3$, $Ga(OC_4H_9)_3$, $Ga(CH_3)_3$, $Ga_2H_6$, $GaH(O_2H_5)_2$, $Ga(OC_2H_5)(C_2H_5)_2$, $In(CH_3)_3$, $In(C_3H_7)_3$, $In(C_4H_9)_3$, etc.

Specific examples for the compound containing Group VA atoms are $NH_3$, $HN_3$, $N_2H_5N_3$, $N_2H_4$, $NH_4N_3$, $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_4H_9)_3$, $P(SCN)_3$, $P_2H_4$, $PH_3$, $AsH_3$, $As(OCH_3)_3$, $As(OC_2H_5)_3$, $As(OC_3H_7)_3$, $As(OC_4H_9)_3$, $As(CH_3)_3$, $As(C_2H_5)_3$, $As(C_6H_5)_3$, $Sb(OCH_3)_3$, $Sb(OC_2H_5)_3$, $Sb(OC_3H_7)_3$, $Sb(OC_4H_9)_3$, $Sb(CH_3)_3$, $Sb(C_3H_7)_3$, $Sb(C_4H_9)_3$, etc.

In this invention, these compounds as the film forming raw material (i) is selectively used. But it is possible to use a mixture of two or more of these compounds.

As for the halogen series oxidizing agent (ii), a substance which is in gaseous state when introduced into the film deposition space and which can effectively oxidize the film forming raw material (i) when contacted in the film deposition space is selectively used.

Such substance can include halogen gases such as $F_2$ gas, $Cl_2$ gas, $Br_2$ gas, $I_2$ gas and ClF gas. Among these halogen gases, $F_2$ gas is the most desirable.

Such halogen gas as the halogen series oxidizing agent (ii) is introduced into the film deposition space at the same time but separately when the film forming raw material gas (i) and the raw material gas to impart a valence electron controlling element (iii) are separately introduced thereinto with a predetermined flow rate and under a predetermined pressure condition and collide with other two raw material gases to cause chemical reactions and to promote the generation of plural kinds of precursors containing excited precursors. At least one kind of those generated precursors act as a film forming supplier. In this process, the excited precursor generated therein becomes a different kind of precursor or another kind of exciter precursor through successive decomposition or chemical reaction, or it sometimes liberates energy. The excited precursor eventually collides the surface of the substrate placed while being maintained at a predetermined temperature in the film deposition space and brings about the formation of a deposited film having a three dimensional network structure on the substrate. In this system, the energy level of the excited precursor generated as a result of the chemical reaction among the three kinds of raw materials is preferred to be either such that is transited to a lower energy level or such that is accompanied with an emission during the process when the excited precursor is changed into another kind of chemical species. Because of the generation of plural kinds of such excited precursors which are characterized by an emission for its energy transition, the film formation process of a functional epitaxial film or a functional polycrystalline film is effectively promoted with a lower consumption of power energy to thereby obtain such film layer with an uniform thickness and a desirable homogeneity and which has a wealth of many practically applicable characteristics.

The raw material to impart a valence electron controlling element (iii) is preferred to be a substance which is in a gaseous state at room temperature under atmospheric pressure condition or another substance which can be easily made to be in a gaseous state by way of a gasifying device.

In the case of forming a semiconductor film constituted with silicon atoms or germanium atoms, the raw material to impart a valence electron controlling element (iii) may be a substance which contains as the constituent an element of Group IIIA of the Periodic Table such as B, Al, Ga, In and Tl or another substance which contains as the constituent an element of Group VA of the Periodic Table such as N, P, As, Sb and Bi.

Specific examples are $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc.

When such substance in a gaseous state is introduced into the film deposition space, it is possible to be introduced thereinto independently or together with the film forming raw material gas (i).

In the case of preparing the semiconductor film constituted with Group IIB atoms and Group VIA atoms as above mentioned, a substance containing an element of Group IIIA, Group IVA or Group VA of the Periodic Table is selectively used as the raw material to impart a valence electron controlling element (iii).

And in the case of preparing the semiconductor film constituted with Group IIIA atoms and Group VA atoms as above mentioned, a substance containing an element of Group IIB, Group IVA or Group VIA of the Periodic Table is selectively used.

In a specific example, as the raw material to impart a valence electron controlling element (iii), it is possible to use an appropriate substance to be used as the film forming raw material (i) in case where so desired.

A substance containing carbon atoms such as chain hydrocarbon, cyclic hydrocarbon or their derivatives of which part or all of the hydrogen atoms are substituted with halogen atoms can be used.

Specific examples for such substance are chain carbon halides of the general formula: $CuY_{2u+2}$ wherein u is an integer of 1 or more and Y is F, Cl, Br or I, cyclic carbon halides of the general formula: $CvY_{2v}$ wherein v is an integer of 3 or more and Y has the same meaning as above identified, and chain or cyclic hydrocarbons of the general formula: $CuHxYy$ wherein u and Y have the same meanings as above identified and $x+y=2u$ or $2u+2$.

There can be also used a tin-containing substance or a lead-containing substance.

Specific examples for the tin-containing substance are $SnH_4$, $SnCl_4$, $SnBr_4$, $Sn(CH_3)_4$, $Sn(C_2H_5)_4$, $Sn(C_3H_7)_4$, $Sn(C_4H_9)_4$, $Sn(OCH_3)_4$, $Sn(OC_2H_5)_4$, $Sn(i-OC_3H_7)_4$, $Sn(t-OC_4H_9)_4$, Specific examples for the lead-containing substance are $Pb(CH_3)_4$, $Pb(C_2H_5)_4$, $Pb(C_4H_9)_4$, etc.

It is possible to use two or more kinds of these substances at the same time, for example, by mixing them and introducing the mixture into the film deposition space.

When said substance in a gaseous state is introduced into the film deposition space, it is possible to be introduced thereinto independently or together with the film forming raw material gas (i).

In the process for forming a functional epitaxial film or a functional polycrystalline film according to this invention, the conditions upon forming such film, for example, the combination of the three kinds of the raw materials, namely, the film forming raw material (i), the halogen series oxidizing agent (ii) and the raw material to impart a valence electron controlling agent (element) (iii), their mixing ratios, the gas pressure upon mixing those substances in the film forming space, their gas flow rates, the internal pressure upon forming such film on the substrate, the carrier gas flow rate, the temperatures and the film forming atmosphere, and the flow type of each gaseous substance when introduced into the film deposition space are important factors for obtaining the functional epitaxial film or the functional polycrystalline film having desired characteristics, and they are appropriately selected while considering the functions required for such film to be formed. Further, since these film forming conditions are organically correlated and may be varied depending upon the kind and the amount of each of the atoms contained in the film, the conditions are to be determined taking these relationships into consideration.

The volume ratio of the film forming raw material gas (i) to the halogen series oxidizing agent gas on the basis of the flow ratio is properly determined depending upon the related factors. It is preferably 1/20 to 100/1, and more preferably 1/5 to 50/1.

The volume ratio of the gaseous raw material to impart a valence electron controlling element (iii) to the film forming raw material gas (i) is properly determined depending upon the characteristics required for the film to be formed.

It is preferably 1/1,000,000 to 1/10, more preferably 1/100,000 to 1/20, and most preferably, 1/100,000 to 1/50.

The gas pressure in the film deposition space when the foregoing gaseous raw materials are mixed is preferred to be high in order to facilitate their chemical contacts, and is properly determined while considering their reactivities. It is preferably $1 \times 10^{-7}$ to 5 Atmospheres of pressure, and more preferably $1 \times 10^{-6}$ to 2 atmospheres of pressure.

The internal pressure in the film deposition space, namely, the pressure of the inner space wherein the substrate is placed is appropriately determined with due regard to the excited precursors to be generated in that inner space and to the conditions which let those precursors derived from the excited precursors to become effective in forming a semiconductor film.

The internal pressure in the film forming space in the case where the reaction region is open-connected to the film forming region can be adjusted with the use of a differential exhausting means or a large scale exhausting device while having due regard to the correlated conditions relating to the introducing pressure and the introducing flow rate for each of the film forming raw material gas (i), the halogen series oxidizing agent gas (ii) and the gaseous raw material to impart a valence electron controlling element (iii) when they are introduced into the film deposition space.

In the case where the conductance of the connecting part between the reaction region and the film forming region is relatively small, the internal pressure in the film forming region can be adjusted by controlling the amount of the exhausting gas by operating an exhausting device being connected to the film forming region.

Further in the case where the reaction region and the film forming region are united and they are not structurally separated, it is desirable to conduct the gas exhaustion with a differential gas exhausting means or with the use of a large scale gas exhausting device.

As above mentioned, the internal pressure in the film forming space is determined while having a due regard on the correlative pressure conditions in introducing the foregoing three kinds of gaseous raw materials into the film deposition space.

However, in general, the internal pressure is preferably, 0.001 to 100 Torr, more preferably, 0.01 to 30 Torr, and most preferably, 0.05 to 10 Torr.

As for the form of the gas flow into the film forming space for each of the foregoing gaseous raw materials, they are appropriately designed with due regard to the geometrical arrangement of the gas flow inlet, the substrate and the gas flow outlet so that the foregoing gaseous raw materials may be effectively introduced, and homogeneously and well mixed in the predetermined region of the film deposition space to generate desired precursors and to bring about the effective formation of a semiconductor film on the substrate.

The excitation energy to be employed in the second embodiment of this invention can be heat energy, light energy or conversion energy from said energy. The light energy can be electromagnetic energy.

It is possible to appropriately control the quality of the resulting deposited film to be from polycrystalline state to monocrystalline state by selecting the kind of the excitation energy source to be used and appropriately changing the luminous energy per an unit hour, the irradiation period or other related conditions.

In specific examples for the irradiation of such excitation energy, those excitation energy sources such as laser of Ar, ruby, yag or excimer, electron beam, ion beam, high power lamp or high power heater can be optionally used. And an excitation energy of such source is applied on the film or on the substrate where the film formation process is being proceeded.

The application of the excitation energy of such source is usually conducted in the pulse state or by CW scanning, and is continued for a longer period than the accommodation coefficient of the film to be deposited.

As for the substrate to be used in this invention, Si-monocrystal wafer plate or GaAs-monocrystal wafer plate are the most appropriate since a indeed desired functional epitaxial film may be formed when such plate is used as the substrate.

However, in order to effectively attain the objects of this invention, it is possible to use sapphire monocrystal plate, $Al_2O_3$ plate, silica plate, polycrystal silicon plate, amorphous silicon plate or the like as the substrate. In that case, not only a desired functional epitaxial film but also a desired polycrystalline functional film may be appropriately formed.

The temperature (Ts) of the substrate in this invention should be properly determined depending upon the kind of a film to be formed and the kind of a substrate to be used.

For instance, in the first embodiment of this invention, in the case of forming a silicon containing epitaxial film, the Ts is preferably 200° C. to 900° C. and more preferably 300° C. to 800° C. And in the case of forming a germanium containing epitaxial film, the Ts is preferably 150° C. to 700° C. and more preferably 250° C. to 600° C.

In any case, the better the orientation of a substrate to be used is, at the lower substrate temperature an epitaxial film having the better quality can be formed.

PREFERRED EMBODIMENT OF THE INVENTION

Figure 2:
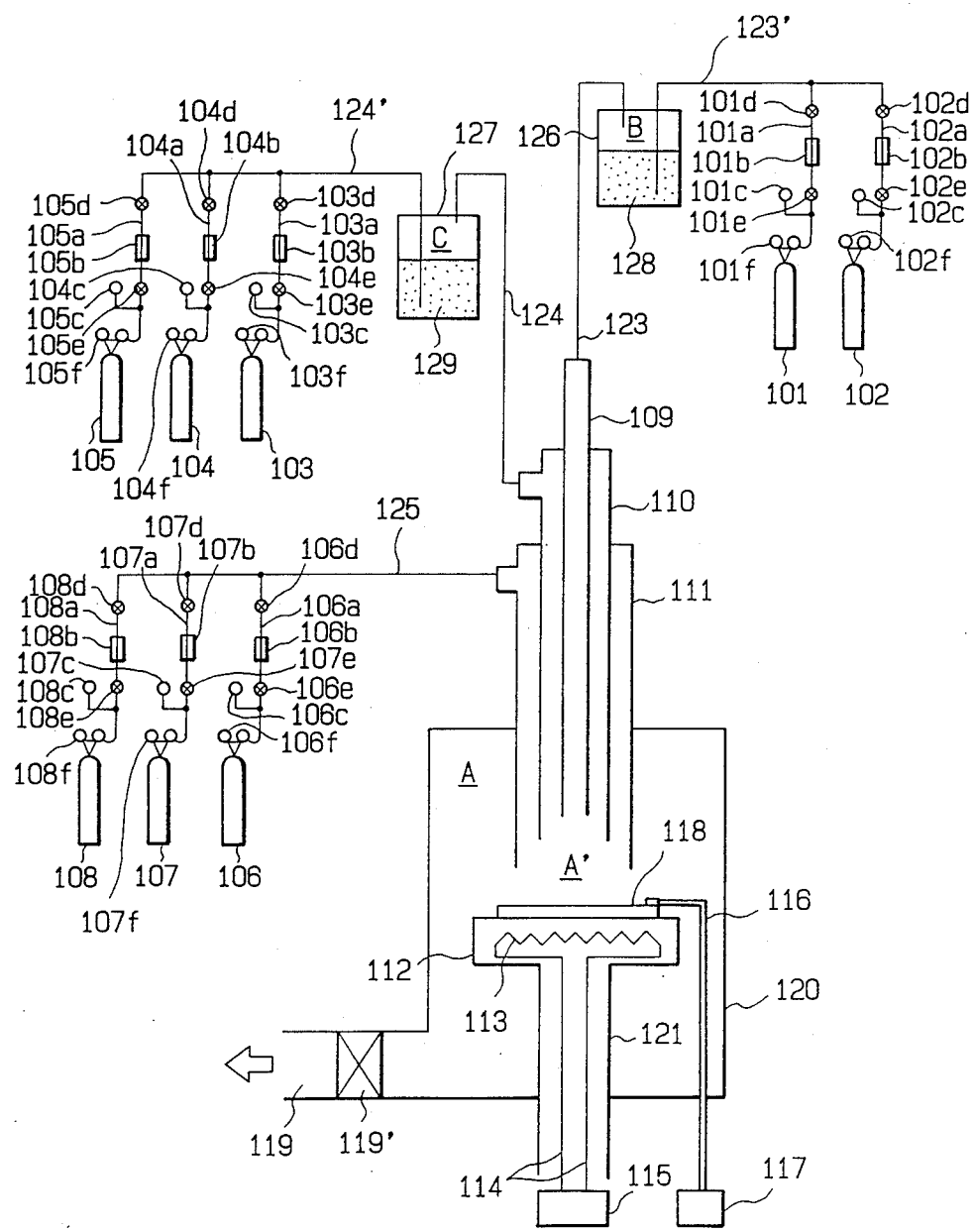
FIGS. 2 through 3 are schematic views illustrating modified representative examples of the apparatus shown in FIG. 1.
Figure 3:
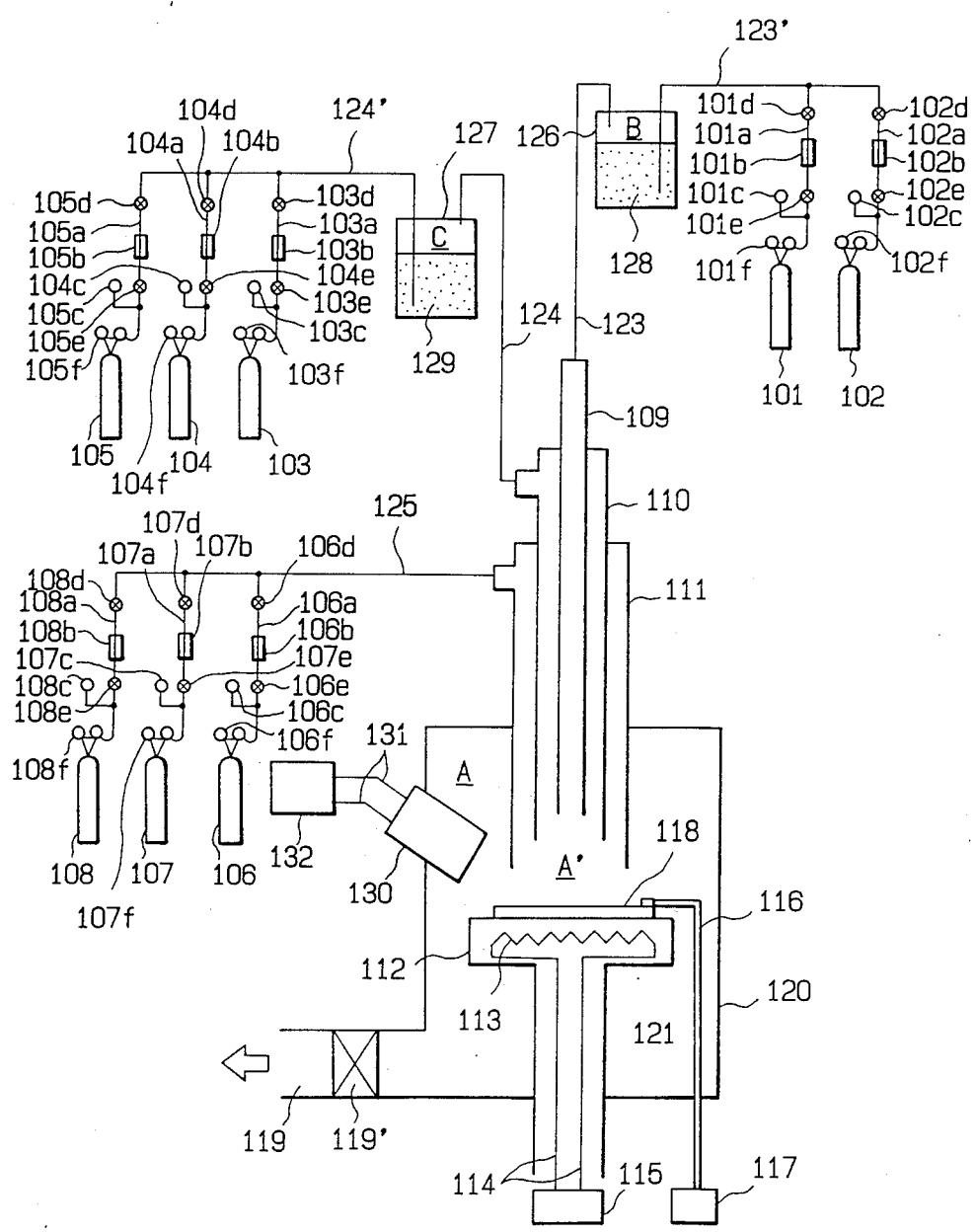

FIG. 1 is a schematic view illustrating a representative apparatus for practicing the process according to this invention. FIGS. 2 through 3 are schematic views illustrating modified representative examples of the apparatus shown in FIG. 1.

In FIG. 1, there are shown gas reservoirs 101 through 108, gas supplying pipe ways 101a through 108a respectively extended from the gas reservoirs 101 through 108, mass flow controllers 101b through 108b being placed respectively on the gas supplying pipe ways 101a through 108a for controlling the flow rate of a gas from each of the gas reservoirs, pressure gauges 101c through 108c, main valves 101d through 108d, sub-valves 101e through 108e and gas reservoir pressure gases 101f through 108f.

With reaction chamber 120, there are provided first gas supplying conduit 109, second gas supplying conduit 110 and third gas supplying conduit 111 which are extended into a film deposition space A of reaction chamber 120 through its upper wall and ended leaving a space A' sufficient enough to form a reaction region between a substrate 118 to be placed therein.

As for the first, second and third gas supplying conduits 109, 110 and 111, there is used a concentric triple conduit having a first circular space as the first gas supplying conduit 109, a second circular space as the second gas supplying conduit 110 and a cylindrical space positioned in the middle as the third gas supplying conduit 111.

The end portion of the concentric triplicate conduit in the film deposition space A is desired to be in such a form as showing an inwardly cut surface at an external appearance with leaving a round space A' to function as the reaction region. With the inwardly cut surface, the outlet of each of the gas supplying conduits 109, 110 and 111 is downwardly open.

In an alternative, the end portion of the concentric triplicate conduit may be structured in such a way that the outlet of the third gas supplying conduit 111 in the cylindrical form is positioned in the innermost recess and the remaining end portion composed of the outlets of the first and second gas supplying conduits is in a diagonally cut surface form so as to leave a space in the form of a conic trapezoid A' to function as the reaction region.

To the first gas supplying conduit 109, a gas feeding pipe 123 for the gas from the gas reservoirs 101 and 102 is connected. To the second gas supplying conduit 110, a gas feeding pipe 124 for the gas from the gas reservoirs 103, 104 and 105 is connected. To the third gas supplying conduit 111, a gas feeding pipe 125 for the gas from the gas reservoirs 106, 107 and 108 is connected.

With the bottom part of the reaction chamber 120, there is provided an exhaust pipe 119 having a vacuum valve 119'. The exhaust pipe 119 is connected to an exhausting device (not shown).

The air or gas in the gas feeding pipes 123, 124 and 125, the gas supplying conduits 109, 110 and 111 and the reaction chamber 120 can be evacuated by operating the exhausting device through the exhaust pipe 119.

The substrate 118 is placed on substrate holder 112 which can be shifted upwardly or downwardly with a driving means (not shown), and in which a heater 113 for the substrate is installed.

The heater 113 is electrically connected to an electric power source 115 through leading wires 114. In order to measure the temperature of the substrate 118, there is provided a thermocouple 116 being electrically connected to a temperature indicator 117 with the reaction chamber 120.

The position of the substrate 118 upon forming a deposited film thereon is appropriately adjusted by shifting the substrate holder 112 so that there is left a desired distance between the surface of the substrate 118 and the outlets of the gas supplying conduits 109, 110 and 111.

Such desired distance is determined properly depending upon the kind of a deposited film to be formed, its characteristics as expected, the flow rate of a gas to be employed, the internal pressure in the vacuum chamber and the like.

However, in general, it is preferably several millimeters to 20 cm, and more preferably 5 mm to 15 cm.

The heater 113 is operated usually to heat the substrate 118 to an appropriate temperature or to conduct a provisional heat treatment on the substrate. However, the heater 113 can be used to anneal the deposited film formed on the substrate.

FIG. 2 is a schematic view illustrating a modified representative example of the apparatus shown in FIG. 1, in which are shown bubblers 126 and 127. As for the bubbler 126, there is stored a film forming raw material liquid 128 therein leaving a space B for a gas to be generated. A gas feeding pipe 123' from the gas reservoirs 101 and 102 is extended into the film forming raw material liquid 128 so that a film forming raw material gas may be generated by blowing an appropriate gas such as an inert gas thereinto to thereby bubble the liquid. The thus generated film forming raw material gas in the space B is fed through the gas feeding pipe 123 into the reaction chamber 120.

As for the bubbler 127, there is stored a film forming raw material liquid 129 therein leaving a space C for a gas to be generated. A gas feeding pipe 124' from the gas reservoirs 103, 104 and 105 is extended into the film forming raw material liquid 129 so that a film forming raw material gas may be generated by blowing an appropriate gas such as an inert gas thereinto to thereby bubble the liquid. The thus generated film forming raw material gas in the space C is fed through the gas feeding pipe 124 into the reaction chamber 120.

FIG. 3 is a schematic view illustrating a modified representative example of the apparatus shown in FIG. 2. That is, there is provided an excitation energy generating means 130 with the side wall of the reaction chamber 120 in the way that an excitation energy such as heat energy or light energy may be applied toward the substrate 118. The excitation energy generating means 130 is electrically connected through lead wires 131, 131 to an electric power source 132.

The excitation energy generating means 130 may be provided with the reaction chamber 120 of any of the apparatus of FIGS. 1 and 2. In any of the apparatus of FIGS. 2 and 3, it is possible to omit either the bubbler 126 or the bubbler 127 in case where necessary.

The advantages of this invention are now describe in more detail by reference to the following Examples 1 to 54, which are provided merely for illustrative purposes only, and are not intended to limit the scope of this invention.

EXAMPLE 1

Three kinds of epitaxial films were prepared using the apparatus shown in FIG. 1.

In each case, an n+-type Si-monocrystal wafer plate of 3 inches in diameter was used as the substrate 118, and the distance between the substrate 118 and the end portion of the outlet of the gas supplying conduit 111 was adjusted to be 5 cm.

The wafer plate was firmly disposed to the surface of the substrate holder 112 placed at the predetermined position in the reaction chamber 120. The air in the film forming space A was evacuated by opening the vacuum valve 119' to bring the space to a vacuum of about $10^{-5}$ Torr. Then, the heater 113 was actuated to heat uniformly the wafer plate 800° C., and the plate was maintained at this temperature.

In parallel, SiH$_4$ gas from the reservoir 101 was fed into the reaction region A' through the gas supplying conduit 109 at a flow rate of 30 SCCM. At the same time, F$_2$ gas from the reservoir 106 and He gas from the reservoir 107 were fed into the reaction region A' respectively at a flow rate of 40 SCCM and at a flow rate of 100 SCCM through the gas supplying conduit 111. At the same time, B$_2$H$_6$/He gas (content of B$_2$H$_6$: 5000 ppm) from the reservoir 103 was fed through the gas supplying conduit 110 into the reaction region A' at the flow rate shown in Table 1, namely, 0.5 SCCM, 5 SCCM then 50 SCCM respectively. After the flow amount of the gases became stable, the vacuum in the reaction chamber 120 was brought to and maintained at about 0.5 Torr by regulating the vacuum valve 119'. Wherein, there was observed a strong blue luminescence throughout the reaction region A' namely all over the confluent part of the gas from the gas supplying conduit 109 and the gas from the gas supplying conduit 111 and the surface of the wafer plate 118.

After one hour, there was formed a silicon-containing film of 15 μm in thickness.

The resulting three kinds of silicon-containing epitaxial films were subjected to X-ray diffraction analysis by X-ray diffractometer. As a result, it was found that there had occurred a crystal growth of the same crystal face (100) at that of the Si-monocrystal wafer as the substrate and it had a slight grid defect in each case.

And, as a result of observing the surface state of each film by scanning electron microscope, it was found that it was of excellent smoothness without any undesirable wave pattern and the unevenness of its thickness was less than ±5%.

The doping efficiency on the respective resulting epitaxial film at room temperature was examined in accordance with van der Pauw method. The results were as shown in Table 1. According to the results of Table 1, it was found that any of the three deposited films had been effectively doped with the p-type dopant.

TABLE 1

| The kind and flow rate of gaseous dopant | $\sigma_d(S \cdot cm^{-1})$ | Hole mobility $(cm^2/V \cdot sec)$ | Carrier density $(cm^{-3})$ |
|---|---|---|---|
| $B_2H_6$ (5000 ppm, diluted with He) 0.5 sccm | $8.0 \times 10^{-4}$ | 300 | $3.0 \times 10^{16}$ |
| $B_2H_6$ (5000 ppm, diluted with He) 5 sccm | $7.5 \times 10^{-3}$ | 180 | $4.0 \times 10^{17}$ |
| $B_2H_6$ (5000 ppm, diluted with He) 50 sccm | $8.5 \times 10^{-2}$ | 90 | $2.5 \times 10^{18}$ |

EXAMPLE 2

The procedures of Example 1 were repeated, except that a p+-type Si-monocrystal wafer plate was used instead of the n+-type Si-monocrystal wafer plate and $PH_3$/He gas (content of $PH_3$: 6000 ppm) was used instead of the $B_2H_6$/He at the flow rate shown in Table 2, namely, 0.5 SCCM, 5 SCCM then 50 SCCM respectively, to thereby prepare three kinds of silicon-containing epitaxial films. The doping efficiency on the respective resulting epitaxial film at room temperature was examined in accordance with van der Pauw method. The results were as shown in Table 2. According to the results of Table 2, it was found that any of the three deposited films had been effectively doped with the n-type dopant.

Table 2

TABLE 2

| The kind and flow rate of gaseous dopant | $\sigma_d(S \cdot cm^{-1})$ | Hole mobility $(cm^2/V \cdot sec)$ | Carrier density $(cm^{-3})$ |
|---|---|---|---|
| $PH_3$ (6000 ppm, diluted with He) 0.5 sccm | $1.0 \times 10^{-3}$ | 900 | $3.5 \times 10^{16}$ |
| $B_2H_6$ (6000 ppm, diluted with He) 5 sccm | $1.5 \times 10^{-2}$ | 750 | $2.0 \times 10^{17}$ |
| $B_2H_6$ (6000 ppm, diluted with He) 50 sccm | $1.0 \times 10^{-1}$ | 200 | $1.0 \times 10^{18}$ |

EXAMPLE 3

The procedures of Example 1 were repeated, except that a silica glass plate of 10 cm × 10 cm in size was used instead of the n+-type Si-monocrystal wafer plate, the flow rate of $F_2$ gas was changed to 50 SCCM and the temperature of the silica glass plate as the substrate 118 was maintained at 850° C., to thereby prepare three kinds of silicon-containing epitaxial films.

As a result that each of the resulting films was subjected to X-ray diffraction analysis in accordance with the same procedures as in Example 1, it was found that an expitaxial film having the (100) crystal face had been formed on the substrate in each case. It was also found that the unevenness of the thickness of the film was less than ±5%. The doping efficiency on the respective resulting epitaxial film at room temperature was examined in accordance with van der Pauw method. The results were as shown in Table 3. According to the results of Table 3, it was found that any of the three epitaxial films had been effectively doped with the p-type dopant.

TABLE 3

| The kind and flow rate of gaseous dopant | $\sigma_d(S \cdot cm^{-1})$ | Hole mobility $(cm^2/V \cdot sec)$ | Carrier density $(cm^{-3})$ |
|---|---|---|---|
| $B_2H_6$ (5000 ppm, diluted with He) 0.5 sccm | $9.5 \times 10^{'4}$ | 280 | $4.0 \times 10^{16}$ |
| $B_2H_6$ (5000 pm, diluted with He) 5 sccm | $8.0 \times 10^{-3}$ | 130 | $4.5 \times 10^{17}$ |
| $B_2H_6$ (5000 ppm, diluted with He) 50 sccm | $1.0 \times 10^{-1}$ | 70 | $3.5 \times 10^{18}$ |

EXAMPLE 4

The procedures of Example 1 were repeated, except that the flow rate of $SiH_4$ gas was changed to 40 SCCM, $PH_3$/He gas (content of $PH_3$: 6000 ppm) was used instead of the $B_2H_6$/He gas at the flow rate shown in Table 4, namely 0.5 SCCM, 5 SCCM then 45 SCCM respectively, to thereby prepare three kinds of silicon-containing epitaxial films.

The doping efficiency on the respective reulting epitaxial film at room temperature was examined in accordance with van der Pauw method. The results were as shown in Table 4. According to the results of Table 4, it was found that any of the three epitaxial films had been effectively doped with the n-type dopant.

TABLE 4

| The kind and flow rate of gaseous dopant | $\sigma_d(S \cdot cm^{-1})$ | Hole mobility $(cm^2/V \cdot sec)$ | Carrier density $(cm^{-3})$ |
|---|---|---|---|
| $PH_3$ (6000 ppm, diluted with He) 0.5 sccm | $2.0 \times 10^{'3}$ | 800 | $5.0 \times 10^{16}$ |
| $PH_3$ (6000 ppm, diluted with He) 5 sccm | $2.5 \times 10^{'2}$ | 650 | $3.0 \times 10^{17}$ |
| $PH_3$ (6000 ppm, diluted with He) 45 sccm | $1.5 \times 10^{-1}$ | 150 | $2.5 \times 10^{18}$ |

EXAMPLE 5

The procedures of Example 1 were repeated, except that a sapphire monocrystal plate was used instead of the n+-type monocrystal wafer plate, the flow rates of the $SiH_4$ gas and the $F_2$ gas were changed to 20 SCCM and 15 SCCM respectively, and the temperature of the sapphire monocrystal plate as the substrate 118 was maintained at 850° C., to thereby prepare three kinds of silicon-containing epitaxial films.

Each of the resulting silicon-containing epitaxial films was subjected to X-ray diffraction analysis by X-ray diffractometer. As a result, it was found that there had occurred a crystal growth of the silicon crystal face (100) on the film surface paralled to the substrate and it had a slight grid defect for each case.

And, as a result of observing the surface state of the film by scanning electron microscope, it was found that it was of excellent smoothness without any undesirable wave pattern and the unevenness of its thickness was less than ±5% for each case.

The doping efficiency on the respective resulting epitaxial film at room temperature was examined in accordance with van der Pauw method. The results were as shown in Table 5. According to the results of Table 5, it was found that any of the three epitaxial films had been effectively doped with the p-type dopant.

TABLE 5

| The kind and flow rate of gaseous dopant | $\sigma_d(S \cdot cm^{-1})$ | Hole mobility $(cm^2/V \cdot sec)$ | Carrier density $(cm^{-3})$ |
|---|---|---|---|
| $B_2H_6$ (5000 ppm, diluted with He) 0.5 sccm | $8.5 \times 10^{-4}$ | 320 | $3.5 \times 10^{16}$ |
| $B_2H_6$ (5000 ppm, diluted with He) 5 sccm | $6.0 \times 10^{-3}$ | 150 | $3.5 \times 10^{17}$ |
| $B_2H_6$ (5000 ppm, diluted with He) 50 sccm | $7.0 \times 10^{-2}$ | 80 | $2.0 \times 10^{18}$ |

EXAMPLE 6

The procedures of Example 5 were repeated, except that the flow rate of the $SiH_4$ gas was changed to 30 SCCM and $PH_3$/He gas (content of $PH_3$: 6000 ppm) was used instead of the $B_2H_6$/He gas at the flow rate shown in Table 6, namely, 0.5 SCCM, 5 SCCM then 45 SCCM respectively, to thereby prepare three kind of silicon-containing epitaxial films.

The doping efficiency on the respective resulting epitaxial film at room temperature was examined in accordance with van der Pauw method. The results were as shown in Table 6. According to the results of Table 6, it was found that any of the three epitaxial films had been effectively doped with the n-type dopant.

TABLE 6

| The kind and flow rate of gaseous dopant | $\sigma_d(S \cdot cm^{-1})$ | Hole mobiltiy $(cm^2/V \cdot sec)$ | Carrier density $(cm^{-3})$ |
|---|---|---|---|
| $PH_3$ (6000 ppm, diluted with He) 0.5 sccm | $1.5 \times 10^{-3}$ | 850 | $4.0 \times 10^{16}$ |
| $PH_3$ (6000 ppm, diluted with He) 5 sccm | $2.0 \times 10^{-2}$ | 700 | $2.5 \times 10^{17}$ |
| $PH_3$ (6000 ppm, diluted with He) 45 sccm | $1.0 \times 10^{-1}$ | 180 | $2.0 \times 10^{18}$ |

EXAMPLE 7

Three kinds of epitaxial films were prepared using the apparatus shown in FIG. 1.

In each case, an $n^+$-type GaAs monocrystal wafer plate of 2 inches in diameter was used as the substrate 118, and the distance between the substrate 118 and the end portion of the outlet of the gas supplying conduit 111 was adjusted to be 6 cm.

The wafer plate was firmly disposed to the surface of the substrate holder 112 placed at the predetermined position in the reaction chamber 120. The air in the film forming space A was evacuated by opening the vacuum valve 119' to bring the space to a vacuum of about $16^{-5}$ Torr. Then, the heater 113 was actuated to heat uniformly the wafer plate at 550° C., and the plate was maintained at this temperature.

In parallel, $GeH_4$ gas from the reservoir 102 was fed into the reaction region A' through the gas supplying conduit 109 at a flow rate of 20 SCCM. At the same time, $F_2$ gas from the reservoir 106 and He gas from the reservoir 107 were fed into the reaction region A' respectively at a flow rate of 30 SCCM and at a flow rate of 90 SCCM through the gas supplying conduit 111. At the same time, $H_2H_6$/He gas (content of $B_2H_6$: 5000 ppm) from the reservoir 103 was fed through the gas supplying conduit 110 into the reaction region A' at the flow rate shown in Table 7, namely, 0.5 SCCM, 4 SCCM then 40 SCCM respectively. After the flow amount of the gases became stable, the vacuum in the reaction chamber 120 was brought to and maintained at about 0.4 Torr by regulating the vacuum valve 119'. Wherein, there was observed a strong blue luminescence throughout the reaction region A' namely all over the confluent part of the gas from the gas supplying conduit 109 and the gas from the gas supplying conduit 111 and the surface of the wafer plate 118. After one hour, there was formed a germanium-containing epitaxial film of 10 μm in thickness.

The resulting three kinds of germanium-containing epitaxial films were subjected to X-ray diffraction analysis by X-ray diffractometer. As a result, it was found that there had occurred a crystal growth of the same crystal face (100) at that of the GaAs-monocrystal wafer as the substrate and it had a slight grid defect in each case.

As a result of observing the surface state of each film by scanning electron microscope, it was found that it was of excellent smoothness without any undesirable wave pattern and the unevenness of its thickness was less than ±5%.

The doping efficiency on the respective resulting epitaxial film at room temperature was examined in accordance with van der Pauw method. The results were as shown in Table 7. According to the results of Table 7, it was found that any of the three epitaxial films had been effectively doped with the p-type dopant.

TABLE 7

| The kind and flow rate of gaseous dopant | $\sigma_3(S \cdot cm^{-1})$ | Hole mobility $(cm^2/V \cdot sec)$ | Carrier density $(cm^{-3})$ |
|---|---|---|---|
| $B_2H_6$ (5000 ppm, diluted with He) 0.5 sccm | 3.0 | 850 | $6.0 \times 10^{16}$ |
| $B_2H_6$ (5000 ppm, diluted with He) | $2.5 \times 10^1$ | 500 | $8.0 \times 10^{17}$ |

TABLE 7-continued

| The kind and flow rate of gaseous dopant | $\sigma_3(S \cdot cm^{-1})$ | Hole mobility $(cm^2/V \cdot sec)$ | Carrier density $(cm^{-3})$ |
|---|---|---|---|
| 50 sccm B$_2$H$_6$ (5000 ppm, diluted with He) 40 sccm | $1.5 \times 10^2$ | 150 | $5.0 \times 10^{18}$ |

EXAMPLE 8

The procedures of Example 7 were repeated, except that a p$^+$-type GaAs-monocrystal wafer plate was used instead of the n$^+$-type GaAs-monocrystal wafer plate and a PH$_3$/He gas (content of PH$_3$: 6000 ppm) was used instead of the B$_2$H$_6$/He gas at the flow rate shown in Table 8, namely 0.5 SCCM, 4 SCCM then 45 SCCM respectively, to thereby prepare three kinds of germanium-containing epitaxial films.

The doping efficiency on the respective resulting epitaxial film at room temperature was examined in accordance with van der Pauw method. The results were as shown in Table 8. According to the results of Table 8, it was found that any of the three epitaxial films had been effectively doped with the n-type dopant.

TABLE 8

| The kind and flow rate of gaseous dopant | $\sigma_d(S \cdot cm^{-1})$ | Hole mobility $(cm^2/V \cdot sec)$ | Carrier density $(cm^{-3})$ |
|---|---|---|---|
| PH$_3$ (6000 ppm, diluted with He) 0.5 sccm | 4.0 | 2800 | $4.5 \times 10^{16}$ |
| PH$_3$ (6000 ppm, diluted with He) 4 sccm | $3.0 \times 10^1$ | 1700 | $6.0 \times 10^{17}$ |
| PH$_3$ (6000 ppm, diluted with He) 45 sccm | $2.0 \times 10^2$ | 500 | $4.0 \times 10^{18}$ |

EXAMPLE 9

The procedures of Example 7 were repeated, except that a silica glass plate of 10 cm × 10 cm in size was used instead of the n$^+$-type GaAs-monocrystal wafer plate, the flow rate of the F$_2$ gas was changed to 600° C. and the temperature of the silica plate as the substrate 118 was maintained at 600° C., to thereby prepare three kinds of epitaxial films.

Each of the resulting germanium-containing epitaxial films was subjected to X-ray diffraction analysis by X-ray diffractometer. As a result, it was found that there had occurred a crystal growth of the germanium crystal face (100) on the film surface parallel to the substrate and it had a slight grid defect for each case.

As a result of observing the surface state of the film by scanning electron microscope, it was found that it was of excellent smoothness without any undesirable wave pattern and the unevenness of its thickness was less than ±5% for each case.

The doping efficiency on the respective resulting films at room temperature was examined in accordance with van der Pauw method. The results were as shown in Table 9. According to the results of Table 9, it was found that any of the three films had been effectively doped with the p-type dopant.

TABLE 9

| The kind and flow rate of gaseous dopant | $\sigma_d(S \cdot cm^{-1})$ | Hole mobility $(cm^2/V \cdot sec)$ | Carrier density $(cm^{-3})$ |
|---|---|---|---|
| B$_2$H$_6$ (5000 ppm, diluted with He) 0.5 sccm | 5.0 | 800 | $5.0 \times 10^{16}$ |
| B$_2$H$_6$ (5000 ppm, diluted with He) 4 sccm | $4.0 \times 10^1$ | 450 | $9.0 \times 10^{17}$ |
| B$_2$H$_6$ (5000 ppm, diluted with He) 45 sccm | $3.5 \times 10^2$ | 120 | $6.0 \times 10^{18}$ |

EXAMPLE 10

The procedures of Example 9 were repeated, except that the flow rate of the GeH$_4$ gas was changed to 25 SCCM and a PH$_3$/He gas (content of PH$_3$: 6000 ppm) was used instead of the B$_2$H$_6$/He gas at the flow rate shown in Table 10, namely 0.5 SCCM, 4 SCCM then 35 SCCM respectively, to thereby prepare three kinds of epitaxial films.

The doping efficiency on the respective resulting deposited films at room temperature was examined in accordance with van der Pauw method. The results were as shown in Table 10. According to the results of Table 10, it was found that any of the three deposited films had been effectively doped with the n-type dopant.

TABLE 10

| The kind of flow rate of gaseous dopant | $\sigma_d(S \cdot cm^{-1})$ | Hole mobility $(cm^2/V \cdot sec)$ | Carrier density $(cm^{-3})$ |
|---|---|---|---|
| PH$_3$ (6000 ppm, diluted with He) 0.5 sccm | 6.0 | 2500 | $5.5 \times 10^{16}$ |
| PH$_3$ (6000 ppm, diluted with He) 4 sccm | $5.0 \times 10^1$ | 1500 | $7.0 \times 10^{17}$ |
| PH$_3$ (6000 ppm, diluted with He) 35 sccm | $1.5 \times 10^2$ | 400 | $5.0 \times 10^{18}$ |

EXAMPLE 11

The procedures of Example 7 were repeated, except that a sapphire monocrystal plate was used instead of the n$^+$-type GaAs-monocrystal wafer plate, the flow rates of the GeH$_4$ gas and the F$_2$ gas were changed to 30 SCCM and 50 SCCM respectively and the temperature of the sapphire monocrystal plate as the substrate 118 was maintained at 580° C., to thereby prepare three kinds of germanium-containing epitaxial films.

Each of the resulting germanium-containing epitaxial films was subjected to X-ray diffraction analysis by X-ray diffractometer. As a result, it was found that there had occurred crystal growth of the germanium crystal face (100) on the film surface parrallel to the substrate and it had a slight grid defect for each case.

As a result of observing the surface state of the film by scanning electron microscope, it was found that it was of excellent smoothness without any undesirable wave pattern and the unevenness of its thickness was less than ±+5% for each case.

The doping efficiency on the respective resulting films at room temperature was examined in accordance with van der Pauw method. The results were as shown in Table 11. According to the results of Table 11, it was found that any of the three films had been effectively doped with the p-type dopant.

TABLE 11

| The kind and flow rate of gaseous dopant | $\sigma_d$ (S · cm$^{-1}$) | Hole mobility (cm$^2$/V · sec) | Carrier density (cm$^{-3}$) |
|---|---|---|---|
| B$_2$H$_6$ (5000 ppm, diluted with He) 0.5 sccm | 4.0 | 820 | 5.5 × 10$^{16}$ |
| B$_2$H$_6$ (5000 ppm, diluted with He) 4 sccm | 3.5 × 10$^1$ | 430 | 8.5 × 10$^{17}$ |
| B$_2$H$_6$ (5000 ppm, diluted with He) 40 sccm | 2.0 × 10$^2$ | 140 | 5.5 × 10$^{18}$ |

EXAMPLE 12

The procedures of Example 11 were repeated, except that the flow rate of the GeH$_4$ gas was changed to 35 SCCM and a PH$_3$/He gas (content of PH$_3$: 6000 ppm) was used instead of the B$_2$H$_6$/He gas at the flow rate shown in Table 12, namely 0.5 SCCM, 5 SCCM then 45 SCCM respectively, to thereby prepare three kind of epitaxial films.

The doping efficiency on the respective resulting films at room temperature was examined in accordance with van der Pauw method. The results were as shown in Table 12. According to the results of Table 12, it was found that any of the three films had been effectively doped with the n-type dopant.

TABLE 12

| The kind and flow rate of gaseous dopant | $\sigma_d$ (S · cm$^{-1}$) | Hole mobility (cm$^2$/V · sec) | Carrier density (cm$^{-3}$) |
|---|---|---|---|
| PH$_3$ (6000 ppm, diluted with He) 0.5 sccm | 5.0 | 2600 | 5.0 × 10$^{16}$ |
| PH$_3$ (6000 ppm, diluted with He) 5 sccm | 4.0 × 10$^1$ | 1600 | 6.5 × 10$^{17}$ |
| PH$_3$ (6000 ppm, diluted with He) 45 sccm | 1.8 × 10$^2$ | 450 | 4.5 × 10$^{18}$ |

EXAMPLE 13

In this example, there was used a modified apparatus that the same kind of the excitation energy generating means as in the apparatus of FIG. 3 is disposed with the side wall of the reaction chamber of the apparatus of FIG. 1.

In this example, three kinds of deposited films were prepared respectively in the Sample Series Nos. 13-1 and 13-2 as shown in Table 13.

In each case, as the substrate 118, a silica glass plate of 10 cm × 10 cm in size was used, and the distance between the substrate 118 and the end portion of the outlet of the gas supplying conduit 111 was adjusted to be 5 cm.

The glass plate was firmly disposed to the surface of the substrate holder 112 placed at the predetermined position in the reaction chamber 120. The air in the film forming space A was evacuated by opening the vacuum valve 119' to bring the space to a vacuum of about 10$^{-5}$ Torr. Then, the heater 113 was actuated to heat uniformly the glass plate to 400° C., and the plate was maintained at this temperature.

In parallel, SiH$_4$ gas from the reservoir 101 was fed into the reaction region A' through the gas supplying conduit 109 at a flow rate of 40 SCCM. At the same time, F$_2$ gas from the reservoir 106 and He gas from the reservoir 107 were fed into the reaction region A' respectively at a flow rate of 60 SCCM and at a flow rate of 120 SCCM through the gas supplying conduit 111. At the same time, B$_2$H$_6$/He gas (content of B$_2$H$_6$: 5000 ppm) from the reservoir 103 was fed through the gas supplying conduit 110 into the reaction region A' at the flow rate shown in Table 13, namely, 0.5 SCCM, 5 SCCM then 50 SCCM respectively. After the flow amount of the gases became stable, the vacuum in the reaction chamber 120 was brought to and maintained at about 0.6 Torr by regulating the vacuum valve 119'. Wherein, there was observed a strong blue luminescence throughout the reaction region A' namely all over the confluent part of the gas from the gas supplying conduit 109 and the gas from the gas supplying conduit 111 and the surface of the glass plate 118.

At the same time when the film formation started, laser beam generated by a ruby laser (wave length: 694 nm, beam diameter: 10 mm) disposed with the reaction chamber 120 was irradiated to the surface of the substrate at an energy density of 1J/cm$^2$ and a pulse width of 40 nS while the substrate holder 112 being horizontally moved at a speed of 1 cm/sec., and under this condition the film forming operation was continued for one hour. The resulting deposited film samples by the above procedures were classified into the Sample Series 13-1 in the following Table 13.

The above procedures were repeated, except that the energy density of the laser beam to be irradiated was changed to 2J/cm$^2$, to thereby prepare three kind of deposited films, which were classified into the Sample Series 13-2.

The resulting deposited film samples were subjected to X-ray diffraction analysis and electron diffraction analysis. As a result, it was found that the deposited films of Sample Series 13-2 were polycrystalline silicon-containing films and the deposited films of Sample Series 13-2 were epitaxial films whose surface parallel to the substrate surface having an orientation close to the crystal face (100).

Further, as a result of observing the state of the particle size on these samples in accordance with Scherrar method, it was found that the particle size on each of the polycrystalline films was about 3 μm. As for the epitaxial films, any unevenness in particle size was not observed on each of them.

And, as a result of observing the surface state of each of the samples by scanning electron microscope, it was found that each of them was of excellent smoothness without any undesirable wave pattern, and the unevenness in thickness was less than ±5% for any of them.

In addition, the layer thickness of them was about 20 μm respectively.

Further, the results of observing the doping efficiency for each of the samples in accordance with van der Pauw method were as shown in Table 13.

According to the results of Table 13, it was found that any of the samples had been effectively doped with the dopant.

TABLE 13

| Sample Series No. | The kind & flow rate of gaseous dopant | $\sigma d\ (S\cdot cm^{-1})$ | Hole mobility (cm/V·sec) | Carrier density $(cm^{-3})$ |
|---|---|---|---|---|
| 13-1 | $B_2H_6$ (5000 ppm, diluted with He) 0.5 sccm | $8.5\times 10^{-8}$ | 80 | $4.5\times 10^{18}$ |
|  | $B_2H_6$ (5000 ppm, diluted with He) 5 sccm | $5.5\times 10^{-7}$ | 35 | $4.0\times 10^{19}$ |
|  | $B_2H_6$ (5000 ppm, diluted with He) 50 sccm | $9.0\times 10^{-6}$ | 10 | $5.0\times 10^{20}$ |
| 13-2 | $B_2H_6$ (5000 ppm, diluted with He) 0.5 sccm | $7.5\times 10^{-4}$ | 320 | $2.5\times 10^{16}$ |
|  | $B_2H_6$ (5000 ppm, diluted with He) 5 sccm | $6.0\times 10^{-3}$ | 200 | $3.5\times 10^{17}$ |
|  | $B_2H_6$ (5000 ppm, diluted with He) 50 sccm | $8.0\times 10^{-2}$ | 90 | $2.0\times 10^{18}$ |

EXAMPLE 14

The procedures of Example 13 were repeated, except that a $p^+$-type Si-monocrystal wafer plate was used instead of the silica glass, and $PH_3$/He gas (content of $PH_3$: 6000 ppm) from the gas reservoir 104 was used instead of the $B_2H_6$/He gas was used at the flow rate shown in Table 14, namely 0.5 SCCM, 4 SCCM then 45 SCCM respectively, to thereby prepare three kinds of deposited films for each of the Sample Series Nos. 14-1 and 14-2 as shown in Table 14.

The doping efficiency at room temperature was examined on each of the samples in accordance with van der Pauw method. The results were as shown in Table 14.

According to the results of Table 14, it was found that any of the samples had been effectively doped with the n-type dopant.

Further, as for the case that the energy density was different as in Example 13, it was found that the samples of the Sample Series No. 14-1 were polycrystalline silicon-containing films and the samples of the Sample Series No. 4-2 were epitaxial silicon-containing films.

TABLE 14

| Sample Series No. | The kind & flow rate of gaseous dopant | $\sigma d\ (S\cdot cm^{-1})$ | Electron mobility $(cm^2/V\cdot sec)$ | Carrier density $(cm^{-3})$ |
|---|---|---|---|---|
| 14-1 | $PH_3$ (6000 ppm, diluted with He) 0.5 sccm | $7.0\times 10^{-8}$ | 190 | $3.0\times 10^{18}$ |
|  | $PH_3$ (6000 ppm, diluted with He) 5 sccm | $4.0\times 10^{-7}$ | 60 | $2.5\times 10^{19}$ |
|  | $PH_3$ (6000 ppm, diluted with He) 50 sccm | $7.5\times 10^{-6}$ | 10 | $3.0\times 10^{20}$ |
| 14-2 | $PH_3$ (6000 ppm, diluted with He) 0.5 sccm | $6.0\times 10^{-4}$ | 850 | $3.5\times 10^{16}$ |
|  | $PH_3$ (6000 ppm, diluted with | $5.0\times 10^{-3}$ | 450 | $2.0\times 10^{17}$ |

TABLE 14-continued

| Sample Series No. | The kind & flow rate of gaseous dopant | $\sigma d \, (S \cdot cm^{-1})$ | Electron mobility $(cm^2/V \cdot sec)$ | Carrier density $(cm^{-3})$ |
|---|---|---|---|---|
| | He)<br>5 sccm<br>PH$_3$<br>(6000 ppm, diluted with He)<br>50 sccm | $7.5 \times 10^{-2}$ | 200 | $3.0 \times 10^{18}$ |

EXAMPLE 15

The procedure of Example 13 were repeated, except that GeH$_4$ gas from the gas reservoir 102 was fed through the gas supplying conduit 109 at a flow rate of 30 SCCM into the reaction region A' instead of the SiH$_4$ gas, the flow rate of the F$_2$ gas was changed to 50 SCCM, the temperature of the substrate was maintained at 200° C., and a halogen lamp was used instead of the ruby laser, to thereby prepare three kinds of deposited films in each of the Sample Series Nos. 15-1 and 15-2 as shown in Table 15.

In the Sample Series No. 15-1, the substrate was activated with a lamp power of 5.0 kW intermittently at about 50 second interval.

In the Sample Series No. 15-2, the substrate was activated with a lamp power of 20 kW at about 50 second interval.

The thickness of each of the resulting deposited films was about 5μm.

The resulting deposited film samples were subjected to X-ray diffraction anaylsis and electron diffraction analysis.

As a result, it was found that the deposited films of Sample Series No. 15-1 were polycrystal germanium-containing films and the deposited films of Sample Series No. 15-2 were epitaxial films whose surface parallel to the substrate surface having an orientation close to the crystal face (100).

Further, as a result of observing the state of the particle size on these samples in accordance with Scherrar method, it was found that the particle size on each of the polycrystal films was about 5.5μm. As for the epitaxial films, any unevenness in particle size was not observed on each of them.

As a result of observing the surface state of each of the samples by scanning electron microscope, it was found that each of them was of excellent smoothness without any undesirable wave pattern, and the unevenness in thickness was less than ±5% for any of them.

Further, the results of observing the doping efficiency for each of the samples in accordance with van der Pauw method were as shown in Table 15.

According to the results of Table 15, it was found that any of the samples had been effectively doped with the n-type dopant.

TABLE 15

| Sample Series No. | The kind & flow rate of gaseous dopant | $\sigma d \, (S \cdot cm^{-1})$ | Hole mobility $(cm^2/V \cdot sec)$ | Carrier density $(cm^{-3})$ |
|---|---|---|---|---|
| 15-1 | B$_2$H$_6$<br>(5000 ppm, diluted with He)<br>0.5 sccm | $4.0 \times 10^{-3}$ | 120 | $4.5 \times 10^{18}$ |
| | B$_2$H$_6$<br>(500 ppm, diluted with He)<br>5 sccm | $2.5 \times 10^{-2}$ | 55 | $4.0 \times 10^{19}$ |
| | B$_2$H$_6$<br>(5000 ppm, diluted with He)<br>50 sccm | $5.0 \times 10^{-1}$ | 10 | $6.5 \times 10^{20}$ |
| 15-2 | B$_2$H$_6$<br>(5000 ppm, diluted with He)<br>0.5 sccm | 4.0 | 900 | $5.5 \times 10^{16}$ |
| | B$_2$H$_6$<br>(5000 ppm, diluted with He)<br>5 sccm | $2.0 \times 10^{1}$ | 600 | $7.5 \times 10^{17}$ |
| | B$_2$H$_6$<br>(5000 ppm, diluted with He)<br>50 sccm | $3.0 \times 10^{2}$ | 180 | $5.0 \times 10^{18}$ |

EXAMPLE 16

The procedures of Example 15 were repeated, except that a p$^+$-type GaAs-monocrystal wafer was used instead of the silica glass plate, the flow rate of the GeH$_4$ was changed to 40 SCCM and PH$_3$/He gas (content of PH₃: 6000 ppm) was used instead of the $B_2H_6$/He gas at the flow rate shown in Table 16, namely 0.5 SCCM, 5 SCCM then 45 SCCM respectively, to thereby prepare three kinds of germanium-containing deposited films for each of the Sample Series Nos. 16-1 and 16-2.

The results of observing the doping efficiency for each of the samples in accordance with van der Pauw method were as shown in Table 16.

According to the results of Table 16, it was found that any of the samples had been effectively doped with the n-type dopant.

It was confirmed that by changing the lamp power of the halogen lamp, there could be formed a germanium-containing polycrystalline film and a germanium-containing epitaxial film as desired.

conduit 109 into the reaction region A'. Further in parallel, $F_2$ gas from the gas reservoir 106 was fed at a flow rate of 80 SCCM through the gas feeding pipe 125 and the gas supplying conduit 111 into the reaction region A'.

After the flow amount of the gases became stable, the vacuum in the reaction chamber 120 was brought to and maintained at about 0.5 Torr by regulating the vacuum valve 119'. And the substrate 118 was maintained at 300° C.

At the same time when the film formation started, laser beam generated by a ruby laser (wave length: 694 nm, beam diameter: 10 mm) as the excitation energy from the excitation energy generating means 130 was irradiated to the surface of the substrate at an energy

TABLE 16

| Sample Series No. | The kind & flow rate of gaseous dopant | $\sigma d$ (S · cm$^{-1}$) | Electron mobility (cm²/V · sec) | Carrier density (cm$^{-3}$) |
| --- | --- | --- | --- | --- |
| 16-1 | PH₃ (6000 ppm, diluted with He) 0.5 sccm | $5.5 \times 10^{-3}$ | 300 | $7.0 \times 10^{18}$ |
| | PH₃ (6000 ppm, diluted with He) 5 sccm | $4.0 \times 10^{-2}$ | 160 | $6.5 \times 10^{19}$ |
| | PH₃ (6000 ppm, diluted with He) 45 sccm | $3.5 \times 10^{-1}$ | 25 | $6.0 \times 10^{20}$ |
| 16-2 | PH₃ (6000 ppm, diluted with He) 0.5 sccm | 3.0 | 2700 | $4.0 \times 10^{16}$ |
| | PH₃ (6000 ppm, diluted with He) 5 sccm | $2.5 \times 10^{1}$ | 1800 | $5.5 \times 10^{17}$ |
| | PH₃ (6000 ppm, diluted with He) 45 sccm | $3.5 \times 10^{2}$ | 550 | $3.5 \times 10^{18}$ |

EXAMPLE 17

In this example, there was used the apparatus shown in FIG. 3, in which the bubbler 126 was omitted and in stead, the feeding pipe 123 was directly connected to the series of the gas reservoirs 101 and 102 as in the apparatus of FIG. 1.

In the babbler 127, there was stored a combination of trimethylgallium and dimethylzinc [Ga(CH₃)₃: Zn(CH₃)₂ = 10⁴:1].

As the substrate 118, there was used a Al₂O₃ plate of 8 cm×6 cm in size, and the distance between the substrate 118 and the end portion of the gas supplying conduit 111 was adjusted to be 4 cm.

Then, He gas from the reservoir 104 was fed at a flow rate of 30 SCCM into said combination in the bubbler 127 and said combination was bubbled to generate a He gas containing a saturated amount of Ga(CH₃)₃ and a trace amount of Zn(CH₃)₂, which was introduced through the gas supplying conduit 110 into the reaction region A'. At the same time, arsine (AsH₃) from the gas reservoir 101 was fed at a flow rate of 30 SCCM through the gas feeding pipe 123 and the gas supplying density of 0.6 J/cm² and a pulse width of 40 nS while the substrate holder 112 being horizontally moved at a speed of 2 cm/sec., and under this condition the film forming operation was continued for 20 minutes. The resulting deposited film sample by the above procedures was indicated as Sample No. 17-1 in the following Table 17.

The above procedures were repeated, except that the energy density of the laser beam to be irradiated was changed to 1.5 J/cm², to thereby prepare a deposited film, which was indicated as Sample No. 17-2 in the following Table 17.

The resulting deposited film samples were subjected to X-ray diffraction analysis and electron diffraction analysis. As a result, it was found that the deposited film of Sample No. 17-1 was a polycrystalline GaAs-containing film and the deposited film of Sample No. 17-2 was an epitaxial GaAs-containing film whose surface parallel to the substrate surface having an orientation close to the crystal face (100).

Further, as a result of observing the state of the particle size on these samples in accordance with Scherrar method, it was found that the particle size on the polycrystalline film was about 2 μm. As for the epitaxial film, any unevenness in particle size was not observed.

As a result of observing the surface state of each of the samples by scanning electron microscope, it was found that each of them was of excellent smoothness without any undesirable wave pattern, and the unevenness in thickness was less than +5% for any of them.

In addition, the layer thickness of them was about 5μm respectively.

Further, the results of observing the doping efficiency for each of the samples in accordance with van der Pauw method were as shown in Table 17.

According to the results of Table 17, it was found that any of the samples had been effectively doped with the n-type dopant.

TABLE 17

| Sample No. | Carrier density ($cm^{-3}$) | Electron mobility ($cm^2/V \cdot sec.$) | $\sigma d$ ($S \cdot cm^{-1}$) |
|---|---|---|---|
| 17-1 | $9.5 \times 10^{19}$ | 20 | $3.0 \times 10^{-2}$ |
| 17-2 | $2.5 \times 10^{17}$ | 150 | 2.0 |

EXAMPLE 18

The procedures of Example 17 were repeated, except that $Ga(CH_3)_3: Sn(C_2H_5)_2 = 10^4:1$ was used instead of the $Ga(CH_3)_3: Zn(CH_3)_2$, to thereby prepare two kinds of GaAs-containing deposited films (Sample Nos. 18-1 and 18-2).

The resulting deposited film samples were subjected to X-ray diffraction analysis and electron diffraction analysis. As a result, it was found that the deposited film of Sample No. 18-1 was a polycrystalline GaAs-containing film and the deposited film of Sample No. 18-2 was a GaAs-containing epitaxial film whose surface parallel to the substrate surface having an orientation close to the crystal face (100).

Further, as a result of observing the state of the particle size on these samples in accordance with Scherrar method, it was found that the particle size on the polycrystalline films was about 2 μm. As for the epitaxial film, any unevenness in particle size was not observed.

As a result of observing the surface state of each of the samples by scanning electron microscope, it was found that each of them was of excellent smoothness without any undesirable wave pattern, and the unevenness in thickness was less than ±5% for any of them.

In addition, the layer thickness of them was about 5μm respectively.

Further, the results of observing the doping efficiency for each of the samples in accordance with van der Pauw method were as shown in Table 18.

According to the results of Table 18, it was found that any of the samples had been effectively doped with the n-type dopant.

TABLE 18

| Sample No. | Carrier density ($cm^{-3}$) | Electron mobility ($cm^2/V \cdot sec.$) | $\sigma d$ ($S \cdot cm^{-1}$) |
|---|---|---|---|
| 18-1 | $3.5 \times 10^{20}$ | 150 | $9.0 \times 10^{-2}$ |
| 18-2 | $9.0 \times 10^{17}$ | 2000 | $3.0 \times 10^{1}$ |

EXAMPLES 19 to 30

Under the conditions shown in Table 19, there were prepared polycrystalline films and epitaxial films containing GaP, GaSb, AlAs, InAs, InP and AlGaAs respectively.

In any case of Examples 19 to 30, it was confirmed that either a polycrystalline film or an epitaxial film could be formed as desired by changing the quantity of a excitation energy to be irradiated properly while the substrate being maintained at low temperature.

As a result of observing the surface state of each of the samples by scanning electron microscope, it was found that each of them was of excellent smoothness without any undesirable wave pattern, and the unevenness in thickness was less then ±5% for any of them.

Further, as a result of the evaluation of film characteristics, there were obtained the results as shown in Table 20. According to the results of Table 20, it was found that any of the samples had practically applicable characteristics.

TABLE 19

| Example | Film forming raw material gas and its flow rate | | Substrate | The temperature of the substrate (°C.) | Excitation energy Irradiation manner | Energy quantity |
|---|---|---|---|---|---|---|
| 19 | $Ga(CH_3)_3:Zn(CH_3)_2 = 10^4:1$/He | 30 sccm | $Al_2O_3$ | 300 | Ar laser | 0.4 J/cm$^2$ |
|  | $PH_3$ | 25 sccm |  |  | CW Scanning | 1.5 J/cm$^2$ |
|  | $F_2$/He | 50/100 sccm |  |  |  |  |
| 20 | $Ga(CH_3)_3:Sn(C_2H_5)_4 = 10^4:1$/He | 30 sccm | P$^+$Si | 300 | Ar laser | 0.4 J/cm$^2$ |
|  | $PH_3$ | 25 sccm | monocrystal |  | CW Scanning | 1.5 J/cm$^2$ |
|  | $F_2$ He | 50/100 sccm |  |  |  |  |
| 21 | $Ga(CH_3)_3$/He | 30 sccm | N$^+$Si | 350 | Flash lamp | 4.0 KW |
|  | $SbH_3/SiH_4$ | 10/0.5 sccm | monocrystal |  |  | 14.0 KW |
|  | $F_2$/He | 40/100 sccm |  |  |  |  |
| 22 | $Ga(CH_3)_3$/He | 30 sccm | $SiO_2$ | 350 | Flash lamp | 4.0 KW |
|  | $SbH_3/SiH_4$ | 45/0.5 sccm |  |  |  | 14.0 KW |
|  | $F_2$/He | 40/100 sccm |  |  |  |  |
| 23 | $Al(CH_3)_3$/He | 25 sccm | $CaF_2$ | 400 | Ruby laser | 0.8 J/cm$^2$ |
|  | $AsH_3/SiH_4$ | 10/0.5 sccm |  |  |  | 2.0 J/cm$^2$ |
|  | $F_2$/He | 50/100 sccm |  |  |  |  |
| 24 | $Al(CH_3)_3$/He | 25 sccm | $Al_2O_3$ | 400 | Ruby laser | 0.8 J/cm$^2$ |
|  | $AsH_3/SiH_4$ | 30/0.5 sccm |  |  |  | 2.0 J/cm$^2$ |
|  | $F_2$/He | 50/100 sccm |  |  |  |  |
| 25 | $In(CH_3)_3$/He | 10 sccm | N$^+$GaAs | 250 | Flash lamp | 3.0 KW |
|  | $AsH_3/GeH_4$ | 5/0.2 sccm | monocrystal |  |  | 10.0 KW |
|  | $F_2$/He | 30/80 sccm |  |  |  |  |
| 26 | $In(CH_3)_3$/He | 10 sccm | $SiO_2$ | 250 | Flash lamp | 3.0 KW |
|  | $AsH_3/GeH_4$ | 5/0.2 sccm |  |  |  | 10.0 KW |
|  | $F_2$/He | 30/80 sccm |  |  |  | 10.0 KW |
| 27 | $IN(CH_3)_3$/He | 20 sccm | $Al_2O_3$ | 200 | Air laser | 0.35 J/cm$^2$ |
|  | $PH_3/SiH_4$ | 10/0.5 sccm |  |  | CW Scanning | 1.2 J/cm$^2$ |

TABLE 19-continued

| Example | Film forming raw material gas and its flow rate | | Substrate | The temperature of the substrate (°C.) | Excitation energy Irradiation manner | Energy quantity |
|---|---|---|---|---|---|---|
| 28 | $F_2$/He | 40/90 sccm | | | | |
| | $In(CH_3)_3:Sn(C_2H_5)_4 = 10^4:1$/He | 20 sccm | $P^+$GaAs | 200 | Air laser | 0.3 J/cm$^2$ |
| | $PH_3$ | 10 sccm | monocrystal | | CW Scanning | 1.2 J/cm$^2$ |
| | $F_2$/He | 40/90 sccm | | | | |
| 29 | $Ga(CH_3)_3:Zn(CH_3)_2 = 10^4:1$/He | 25 sccm | $N^+$GaAs | 400 | Ruby laser | 1.0 J/cm$^2$ |
| | $AsH_3$ | 20 sccm | monocrystal | | Pulse | 2.0 J/cm$^2$ |
| | $Al(CH_3)_3$/He | 30 sccm | | | | |
| | $F_2$/He | 60/100 sccm | | | | |
| 30 | $Ga(CH_3)_3:Sn(C_2H_5)_4 = 10^4:1$/He | 25 sccm | $SiO_2$ | 400 | Ruby laser | 1.0 J/cm$^2$ |
| | $AsH_3$ | 20 sccm | | | Pulse | 2.0 J/cm$^2$ |
| | $Al(CH_3)_3$/He | 30 sccm | | | | |
| | $F_2$/He | 60/100 sccm | | | | |

TABLE 20

| Example | Film composition | Conduction type | Mobility of Epitaxial film (cm$^2$/V · sec) | Optical band gap of polycrystalline film (ev) |
|---|---|---|---|---|
| 19 | GaP | P | Hole: 30 | 2.10 |
| 20 | | N | Electron: 80 | 2.20 |
| 21 | GaSb | P | Hole: 1000 | 0.65 |
| 22 | | N | Electron: 3000 | 0.68 |
| 23 | AlAs | P | Hole: 200 | 1.95 |
| 24 | | N | Electron: 650 | 1.90 |
| 25 | InAs | P | Hole: 250 | 0.40 |
| 26 | InAs | N | Electron: 15000 | 0.42 |
| 27 | InP | P | Hole: 160 | 1.35 |
| 28 | | N | Electron: 3200 | 1.33 |
| 29 | AlGaAs | P | Hole: 250 | 1.85 |
| 30 | | N | Electron: 850 | 1.82 |

EXAMPLE 31

In this example, there was used the apparatus shown in FIG. 3, in which the bubbler 126 was omitted and instead, the feeding pipe 123 was directly connected to the series of the gas reservoirs 101 and 102 as in the apparatus of FIG. 1.

In the bubbler 127, there was stored a combination of dimethylzinc and trimethylgallium $[Zn(CH_3)_2:Ga(CH_3)_3 = 10^4:1]$.

As the substrate 118, there was used a silica glass plate of 10 cm × 10 cm in size, and the distance between the substrate 118 and the end portion of the gas supplying conduit 111 was adjusted to be 5 cm.

Then, He gas from the reservoir 104 was fed at a flow rate of 20 SCCM into said combination in the bubbler 127 and said combination was bubbled to generate a He gas containing a saturated amount of $Zn(CH_3)_2$ and a trace amount of $Ga(CH_3)_3$, which was introduced through the gas supplying conduit 110 into the reaction region A'. At the same time, $SeH_2$ gas from the gas reservoir 101 was fed at a flow rate of 25 SCCM through the gas feeding pipe 123 and the gas supplying conduit 109 into the reaction region A'. Further in parallel, $F_2$ gas from the gas reservoir 106 and He gas from the gas reservoir 105 were fed at a flow rate of 80 SCCM and 80 SCCM respectively through the gas feeding pipe 125 and the gas supplying conduit 111 into the reaction region A'.

After the flow amount of the gases became stable, the vacuum in the reaction chamber 120 was brought to and maintained at about 0.4 Torr by regulating the vacuum valve 119'. And the substrate 118 was maintained at 150° C.

At the same time when the film formation started, laser beam generated by a ruby laser (wave length: 694 nm, beam diameter: 10 mm) as the excitation energy from the excitation energy generating means 130 was irradiated to the surface of the substrate at an energy density of 0.3 J/cm$^2$ and a pulse width of 20 nS while the substrate holder 112 being horizontally moved at a speed of 5 cm/sec., and under this condition the film forming operation was continued for 20 minutes. The resulting deposited film sample by the above procedure was indicated as Sample No. 31-1 in the following Table 21.

The above procedures were repeated, except that the energy density of the laser beam to be irradiated was changed to 1.0 J/cm$^2$, to thereby prepare a deposited film, which was indicated as Sample No. 31-2 in the following Table 21.

The resulting deposited film sample were subjected to X-ray diffraction analysis and electron diffraction analysis. As a result, it was found that the deposited film of Sample No. 21-1 was a polycrystalline ZnSe-containing film and the deposited film of Sample No. 21-2 was an epitaxial ZnSe-containing film whose surface parallel to the substrate surface having an orientation close to the crystal face (100).

Further, as a result of observing the state of the particle size on these samples in accordance with Scherrar method, it was found that the particle size on the polycrystalline film was about 1.0 μm. As for the epitaxial film, any unevenness in particle size was not observed.

As a result of observing the surface state of each of the samples by scanning electron microscope, it was found that each of them was of excellent smoothness without any undesirable wave pattern, and the unevenness in thickness was less than ±5% for any of them.

In addition, the layer thickness of them was about 4 μm respectively.

Further, the results of observing the doping efficiency for each of the samples in accordance with van der Pauw method were as shown in Table 21.

According to the results of Table 21, it was found that any of the samples had been effectively doped with the n-type dopant.

TABLE 21

| Sample No. | Carrier density (cm$^{-3}$) | Electron mobility (cm$^2$/V · sec.) | σd(S · cm$^{-1}$) |
|---|---|---|---|
| 31-1 | 9.5 × 10$^{18}$ | 100 | 4.0 × 10$^{-7}$ |
| 31-2 | 2.5 × 10$^{17}$ | 400 | 3.0 × 10$^{-1}$ |

EXAMPLES 32 to 35

Under the conditions shown in Table 22, there were prepared polycrystalline films and epitaxial films containing ZnS, ZnTe, CdTe and CdSe respectively.

In any case of Examples 32 to 35, it was confirmed that either a polycrystalline film or an epitaxial film could be formed as desired by changing the quantity of a excitation energy to be irradiated properly while the substrate being maintained at low temperature.

As a result of observing the surface state of each of the samples by scanning electron microscope, it was found that each of them was of excellent smoothness without any undesirable wave pattern, and the unevenness in thickness was less then ±5% for any of them.

Further, as a result of the evaluation of film characteristics, there were obtained the results as shown in Table 23. According to the results of Table 23, it was found that any of the samples had practically applicable characteristics.

SCCM through the gas feeding pipe 125 and the gas supplying conduit 111 into the reaction region A'.

After the flow amount of the gases became stable, the vacuum in the reaction chamber 120 was brought to and maintained at about 0.5 Torr by regulating the vacuum valve 119'. The substrate 118 was maintained at 450° C.

After 30 minutes, there was obtained a deposited film (Sample No. 36-1).

Then, the resulting deposited film was taken out from the apparatus after it being cooled.

The above procedures were repeated, except that the temperature of the substrate 118 was changed to 600° C., to thereby form another deposited film on another $Al_2O_3$ plate (Sample No. 36-2).

The resulting deposited film samples were subjected

TABLE 22

| Example | Film forming raw material gas and its flow rate | | Substrate | The temperature of the substrate (°C.) | Excitation energy Irradiation manner | Energy quantity |
|---|---|---|---|---|---|---|
| 32 | $Zn(CH_3)_3:Al(CH_3)_3= 10^4:1$/He | 30 sccm | $SiO_2$ | 350 | Ar laser | 0.5 $J/cm^2$ |
|  | $H_2S$ | 15 sccm |  |  | CW Scanning | 1.0 $J/cm^2$ |
|  | $F_2$/He | 40/80 sccm |  |  |  |  |
| 33 | $Zn(CH_3)_2$/He | 25 sccm | $N^+Si$ | 200 | Ruby laser | 0.3 $J/cm^2$ |
|  | $Te(CH_3)_2$/He | 30 sccm | monocrystal |  | Pulse | 0.8 $J/cm^2$ |
|  | $PH_3$ | 0.3 sccm |  |  |  |  |
|  | $F_2$/He | 50/100 sccm |  |  |  |  |
| 34 | $Cd(CH_3)_2$/He | 20 sccm | $Al_2O_3$ | 150 | Flash lamp | 3.0 KW |
|  | $Te(CH_3)_2$/He | 25 sccm |  |  |  |  |
|  | $PH_3$ | 0.2 sccm |  |  |  |  |
|  | $F_2$/He | 40/90 sccm |  |  |  |  |
| 38 | $Cd(CH_3)_2$/He | 25 sccm | $P^+Si$ | 200 | Flash lamp | 4.0 KW |
|  | $SeH_2/SiH_4$ | 20/0.2 sccm | monocrystal |  |  | 10.0 KW |
|  | $F_2$/He | 40/80 sccm |  |  |  |  |

TABLE 23

| Example | Film composition | Conduction type | Mobility of an epitaxial film ($cm^2/V \cdot sec$) | Band gap of polycrystalline film (ev) |
|---|---|---|---|---|
| 32 | ZnS | N | Electron: $5 \times 10^{-3}$ | 3.90 |
| 33 | ZnTe | P | Hole: $6 \times 10^{-3}$ | 2.75 |
| 34 | CdTe | P | Hole: $9 \times 10^{-4}$ | 1.60 |
| 35 | CdSe | N | Electron: $7 \times 10^{-4}$ | 1.85 |

EXAMPLE 36

In this example, there was used the apparatus shown in FIG. 2, in which the bubbler 126 was omitted and instead, the feeding pipe 123 was directly connected to the series of the gas reservoirs 101 and 102 as in the apparatus of FIG. 1.

In the bubbler 127, there was stored a combination of trimethylgallium and dimethylzinc $[Ga(CH_3)_3:Zn(CH_3)_2 = 10^4:1]$.

As the substrate 118, there was used a $Al_2O_3$ plate of 8 cm×6 cm in size, and the distance between the substrate 118 and the end portion of the gas supplying conduit 111 was adjusted to be 4 cm.

He gas from the reservoir 104 was fed at a flow rate of 4 SCCM into said combination in the bubbler 127 and said combination was bubbled to generate a He gas containing a saturated amount of $Ga(CH_3)_3$ and a trace amount of $Zn(CH_3)_2$, which was introduced through the gas supplying conduit 110 into the reaction region A'. At the same time, arsine ($AsH_3$) from the gas reservoir 101 was fed at a flow rate of 20 SCCM through the gas feeding pipe 123 and the gas supplying conduit 109 into the reaction region A'. Further in parallel, $F_2$ gas from the gas reservoir 106 was fed at a flow rate of 80 to X-ray diffraction analysis and electron diffraction analysis. As a result, it was found that the deposited film of Sample No. 36-1 was a polycrystalline GaAs-containing film and the deposited film of Sample No. 36-2 was an epitaxial AgAs-containing film whose surface parallel to the substrate surface having an orientation close to the crystal face (100).

Further, as a result of observing the state of the particle size on these samples in accordance with Scherrar method, it was found that the particle size on the polycrystalline film was about 1.5μm. As for the epitaxial film, any unevenness in particle size was not observed.

As a result of observing the surface state of each of the samples by scanning electron microscope, it was found that each of them was of excellent smoothness without any undesirable wave pattern, and the unevenness in thickness was less than ±5% for any of them.

In addition, the layer thickness of them was about 8 μm respectively.

Further, the results of observing the doping efficiency for each of the samples in accordance with van der Pauw method were as shown in Table 24.

According to the results of Table 24, it was found that any of the samples had been effectively doped with the p-type dopant.

TABLE 24

| Sample No. | Carrier density ($cm^{-3}$) | Hole mobility ($cm^2/V \cdot sec$) | $\sigma d(S \cdot cm^{-1})$ |
|---|---|---|---|
| 36-1 | $8.5 \times 10^{19}$ | 25 | $2.5 \times 10^{-2}$ |
| 36-2 | $1.0 \times 10^{18}$ | 180 | 1.5 |

EXAMPLE 37

The procedures of Example 36 were repeated, except that $Ga(CH_3)_3: Sn(C_2H_5)_2 = 10^4:1$ was used instead of the Ga(CH$_3$)$_3$:Zn(CH$_3$)$_2$, to thereby prepare two kinds of GaAs-containing deposited films (Sample Nos. 37-1 and 37-2).

The resulting deposited film samples were subjected to X-ray diffraction analysis and electron diffraction analysis. As a result, it was found that the deposited film of Sample No. 37-1 was a polycrystalline GaAs-containing film and the deposited film of Sample No. 37-2 was a GaAs-containing epitaxial film whose surface parallel to the substrate surface having an orientation close to the crystal face (100).

Further, as a result of observing the state of the particle size on these samples in accordance with Scherrar method, it was found that the particle size on the polycrystalline films was about 1.5 μm. As for the epitaxial film, any unevenness in particle size was not observed.

As a result of observing the surface state of each of the samples by scanning electron microscope, it was found that each of them was of excellent smoothness without any undesirable wave pattern, and the unevenness in thickness was less than ±5% for any of them.

In addition, the layer thickness of them was about 8 μm respectively,

Further, the results of observing the doping efficiency for each of the samples in accordance with van der Pauw method were as shown in Table 25.

According to the results of Table 25, it was found that any of the samples had been effectively doped with the n-type dopant.

TABLE 25

| Sample No. | Carrier density (cm$^{-3}$) | Electron mobility (cm$^2$/V · sec) | σd(S · cm$^{-1}$) |
|---|---|---|---|
| 37-1 | 2.5 × 10$^{19}$ | 200 | 8.0 × 10$^{-2}$ |
| 37-2 | 8.0 × 10$^{17}$ | 2500 | 2.0 × 10$^1$ |

EXAMPLES 38 to 49

Under the conditions shown in Table 26, there were prepared polycrystalline films and epitaxial films containing GaP, GaSb, AlAs, InAs, InP and AlGaAs respectively.

In any case of Examples 38 to 49, it was confirmed that either a polycrystalline film or an epitaxial film could be formed as desired by changing the temperature of a selected substrate as the substrate 118 properly.

And, as a result of observing the surface state of each of the samples by scanning electron microscope, it was found that each of them was of excellent smoothness without any undesirable wave pattern, and the unevenness in thickness was less than ±5% for any of them.

Further, as a result of the evaluation of film characteristics, there were obtained the results as shown in Table 27. According to the results of Table 27, it was found that any of the samples had practically applicable characteristics.

TABLE 26

| Example No. | Film forming raw material gas & its flow rate | | Substrate | Temperature of the substrate (°C.) |
|---|---|---|---|---|
| 38 | Ga(CH$_3$)$_3$:Zn(CH$_3$)$_2$ = 10$^4$:1/He | 40 sccm | Al$_2$O$_3$ | 400 |
|  | PH$_3$ | 20 sccm |  | 650 |
|  | F$_2$/He | 50/100 sccm |  |  |
| 39 | Ga(CH$_3$)$_3$:Sn(C$_2$H$_5$)$_4$ = 10$^4$:1/He | 40 sccm | P$^+$Si | 400 |
|  | PH$_3$ | 20 sccm | monocrystal | 650 |
|  | F$_2$/He | 50/100 sccm |  |  |
| 40 | Ga(CH$_3$)$_3$:Zn(CH$_3$)$_2$ = 10$^4$:1/He | 25 sccm | n$^+$Si | 450 |
|  | SbH$_3$ | 10 sccm | monocrystal | 700 |
|  | F$_2$/He | 40/100 sccm |  |  |
| 41 | Ga(CH$_3$)$_3$:Sn(C$_2$H$_5$)$_4$ = 10$^4$:1/He | 25 sccm | SiO$_2$ | 450 |
|  | SbH$_3$ | 10 sccm |  | 700 |
|  | F$_2$/He | 40/100 sccm |  |  |
| 42 | Al(CH$_3$)$_3$/He | 20 sccm | CaF$_2$ | 500 |
|  | AsH$_3$/SiH$_4$ | 10/0.2 sccm |  | 750 |
|  | F$_2$/He | 50/100 sccm |  |  |
| 43 | Al(CH$_3$)$_3$/He | 20 sccm | Al$_2$O$_3$ | 500 |
|  | AsH$_3$/SiH$_4$ | 30/0.2 sccm |  | 750 |
|  | F$_2$/He | 50/100 sccm |  |  |
| 44 | In(CH$_3$)$_3$:Zn(CH$_3$)$_2$ = 10$^4$:1/He | 20 sccm | n$^+$GaAs | 350 |
|  | AsH$_3$ | 10 sccm | monocrystal | 600 |
|  | F$_2$/He | 30/80 sccm |  |  |
| 45 | In(CH$_3$)$_3$:Te(CH$_3$)$_2$ = 10$^4$:1/He | 20 sccm | SiO$_2$ | 350 |
|  | AsH$_3$ | 10 sccm |  | 600 |
|  | F$_2$/He | 30/80 sccm |  |  |
| 46 | In(CH$_3$)$_3$/He | 30 sccm | Al$_2$O$_3$ | 350 |
|  | PH$_3$/SiH$_4$ | 15/0.3 sccm |  | 500 |
|  | F$_2$/He | 40/90 sccm |  |  |
| 47 | In(CH$_3$)$_3$:Te(CH$_3$)$_2$ = 10$^4$:1/He | 30 sccm | P$^+$GaAs | 350 |
|  | PH$_3$ | 15 sccm | monocrystal | 500 |
|  | F$_2$/He | 40/90 sccm |  |  |
| 48 | Ga(CH$_3$)$_3$:Zn(CH$_3$)$_2$ = 10$^4$:1/He | 30 sccm | n$^+$GaAs | 500 |
|  | AsH$_3$ | 25 sccm | monocrystal | 700 |
|  | Al(CH$_3$)$_3$/He | 40 sccm |  |  |
|  | F$_2$/He | 80/100 sccm |  |  |
| 49 | Ga(CH$_3$)$_3$:Sn(C$_2$H$_5$)$_4$ = 10$^4$:1/He | 30 sccm | SiO$_2$ | 500 |
|  | AsH$_3$ | 25 sccm |  | 700 |
|  | Al(CH$_3$)$_3$/He | 40 sccm |  |  |
|  | F$_2$/He | 80/100 sccm |  |  |

TABLE 27

| Example No. | Film composition | Conduction type | Mobility of epitaxial film (cm²/V · sec) | Optical band gap of polycrystalline film(eU) |
|---|---|---|---|---|
| 38 | GaP | P | Hole: 40 | 2.15 |
| 39 |  | n | Electron: 90 | 2.25 |
| 40 | GaSb | P | Hole: 900 | 0.60 |
| 41 |  | n | Electron: 2800 | 0.65 |
| 42 | AlAs | P | Hole: 180 | 1.90 |
| 43 |  | n | Electron: 630 | 1.92 |
| 44 | InAs | P | Hole: 240 | 0.45 |
| 45 |  | n | Electron: 24000 | 0.40 |
| 46 | InP | P | Hole: 150 | 1.30 |
| 47 |  | n | Electron: 3100 | 1.35 |
| 48 | AlGaAs | P | Hole: 230 | 1.83 |
| 49 |  | n | Electron: 820 | 1.84 |

EXAMPLE 50

In this example, the same apparatus as used in Example 17 was used.

In the bubbler 127, there was stored a mixture of dimethylzinc and trimethylgallium [$Zn(CH_3)_2$:$Ga(CH_3)_3$ = $10^4$:1].

As the substrate 118, there was used a silica glass plate of 10 cm × 10 cm in size, and the distance between the substrate 118 and the end portion of the gas supplying conduit 111 was adjusted to be 5 cm.

Then, He gas from the reservoir 104 was fed at a flow rate of 30 SCCM into said mixture in the bubbler 127 and said mixture was bubbled to generate a He gas containing a saturated amount of $Zn(CH_3)_2$ and a trace amount of $Ga(CH_3)_3$, which was successively introduced through the gas supplying conduit 110 into the reaction region A'. At the same time, $SeH_2$ gas from the gas reservoir 101 was fed at a flow rate of 20 SCCM through the gas feeding pipe 123 and the gas supplying conduit 109 into the reaction region A'. Further in parallel, $F_2$ gas from the gas reservoir 106 and He gas from the gas reservoir 105 fed at a flow rate of 40 SCCM and 80 SCCM respectively through the gas feeding pipe 125 and the gas supplying conduit 111 into the reaction region A'.

After the flow amount of the gases became stable, the vacuum in the reaction chamber 120 was brought to and maintained at about 0.5 Torr by regulating the vacuum valve 119'. The substrate 118 was maintained at 250° C. After 20 minutes, there was obtained a deposited film (Sample No. 50-1).

Then, the resulting deposited film was taken out from the apparatus after it being cooled.

The above procedures were repeated, except that the temperature of the substrate 118 was changed to 450° C., to thereby form another deposited film on another silica glass plate (Sample No. 50-2).

The resulting deposited film samples were subjected to X-ray diffraction analysis and electron diffraction analysis. As a result, it was found that the deposited film of Sample No. 50-1 was a polycrystalline ZnSe-containing film and the deposited film of Sample No. 50-2 was an epitaxial ZnSe-containing film whose surface parallel to the substrate surface having an orientation close to the crystal face (100).

Further, as a result of observing the state of the particle size on these samples in accordance with Scherrar method, it was found that the particle size on the polycrystalline film was about 1.0 μm. As for the epitaxial film, any unevenness in particle size was not observed.

As a result of observing the surface state of each of the samples by scanning electron microscope, it was found that each of them was of excellent smoothness without any undesirable wave pattern, and the unevenness in thickness was less than ±5% for any of them.

In addition, the layer thickness of them was about 3 μm respectively.

Further, the results of observing the doping efficiency for each of the samples in accordance with van der Pauw method were as shown in Table 28.

According to the results of Table 28, it was found that any of the samples had been effectively doped with the n-type dopant.

TABLE 28

| Sample No. | Carrier density (cm⁻¹) | Electron mobility (cm²/V · sec) | σd(S · cm⁻¹) |
|---|---|---|---|
| 50-1 | $6.5 \times 10^{18}$ | 90 | $5.5 \times 10^{-7}$ |
| 50-2 | $2.0 \times 10^{17}$ | 380 | $4.0 \times 10^{-1}$ |

EXAMPLES 51 to 54

Under the conditions shown in Table 29, there were prepared polycrystalline films and epitaxial films containing ZnS, ZnTe, CdTe and CdSe respectively.

In any case of Examples 51 to 54, it was confirmed that either a polycrystalline film or an epitaxial film could be formed as desired by changing the temperature of a selected substrate properly.

As a result of observing the surface state of each of the samples by scanning electron microscope, it was found that each of them was of excellent smoothness without any undesirable wave pattern, and the unevenness in thickness was less than ±5% for any of them.

Further, as a result of the evaluation of film characteristics, there were obtained the results as shown in Table 30. According to the results of Table 30, it was found that any of the samples had practically applicable characteristics.

TABLE 29

| Example No. | Film forming raw material gas | | Substrate | Temperature of the substrate (°C.) |
|---|---|---|---|---|
| 51 | Zn(CH):Al(CH) = $10^4$:1/He | 40 sccm | P⁺GaAs | 400 |
|  | $H_2S$ | 20 sccm | monocrystal | 700 |
|  | $F_2$/He | 50/80 sccm |  |  |
| 52 | $Zn(CH_3)_2$/He | 30 sccm | n⁺Si | 300 |
|  | $Te(CH_3)_2$/He | 25 sccm | monocrystal | 650 |
|  | $PH_3$ | 0.3 sccm |  |  |
|  | $F_2$/He | 50/100 sccm |  |  |
| 53 | $Cd(CH_3)_2$/He | 30 sccm | $Al_2O_3$ | 250 |
|  | $Te(CH_3)_2$/He | 30 sccm |  | 500 |
|  | $PH_3$ | 0.2 sccm |  |  |
|  | $F_2$/He | 60/90 sccm |  |  |
| 54 | $Cd(CH_3)_2$/He | 30 sccm | P⁺Si | 300 |
|  | $SeH_2$/$SiH_4$ | 25/0.2 sccm | monocrystal | 600 |

TABLE 29-continued

| Example No. | Film forming raw material gas | Substrate | Temperature of the substrate (°C.) |
|---|---|---|---|
| | F$_2$/He | 50/80 sccm | |

TABLE 30

| Example No. | Film composition | Conduction type | Mobility of epitaxial film | Band gap of polycrystalline film |
|---|---|---|---|---|
| 51 | ZnS | n | Electron: 4 × 10$^{-3}$ | 3.92 |
| 52 | ZnTe | P | Hole: 5 × 10$^{-3}$ | 2.73 |
| 53 | CdTe | P | Hole: 8 × 10$^{-4}$ | 1.62 |
| 54 | CdSe | n | Electron: 6.5 × 10$^{-4}$ | 1.83 |

What we claim is:

1. A process for preparing an improved valence electron controlled functional epitaxial film on a substrate, comprising the steps of:
   (a) introducing through a first gas transportation conduit into an evacuated film-forming space having said substrate therein; a gaseous raw material (i) containing hydrogen atoms and silicon atoms or gemanium atoms;
   (b) separately through a second gas transportation conduit concentric with the first gas transportation conduit, introducing a gaseous material (ii) capable of oxidizing the raw material (i), said gaseous material (ii) comprising F$_2$ gas;
   (c) separately, through a third gas transportation conduit concentric with the first and second gas transportation conduits, introducing a gaseous raw material (iii) capable of imparting a valence electron controlling element;
   (d) providing a mixing and reaction region for said gaseous materials (i), (ii) and (iii) adjacent said film forming space at outlets of said first, second and third concentric gas transportation conduits;
   (e) mixing and chemically reacting said three gaseous materials (i), (ii) and (iii) in the absence of a plasma and under reduced pressure in said mixing and reaction region surrounding the surface of said substrate, while controlling the volume ratio of said gaseous material (i) to said gaseous material (ii) to be from 1/20 to 100/1, and the volume ratio of said gaseous material (iii) to said gaseous material (i) to be from 1/1×10$^6$ to 1/10, respectively;
   (f) maintaining said substrate at an elevated temperature to generate a plurality of precursors containing excited precursors and causing at least one of the precursors to form said film; and
   (g) maintaining the length between the outlets of said first, second and third concentric gas transportation conduits forming said mixing and reaction region and the surface of the substrate from about 5 millimeters to 15 centimeters.

2. The process according to claim 1, wherein said raw material (iii) is a compound containing an element of Group IIIA of the Periodic Table as the constituent.

3. The process according to claim 2, wherein said compound is a member selected from the group consisting of B$_2$H$_6$, B$_4$H$_{10}$, B$_5$H$_9$, B$_5$H$_{11}$, B$_6$H$_{10}$, B$_6$H$_{12}$, Al(CH$_3$)$_3$, Al(CH$_2$H$_5$)$_3$, Ga(CH$_3$)$_3$, and In(CH$_3$)$_3$.

4. The process according to claim 1, wherein said raw material (iii) is a compound containing an element of Group VA of the Periodic Table as the constituent.

5. The process according to claim 4, wherein said compound is a member selected from the group consisting of NH$_3$, HN$_3$, N$_2$H$_5$N$_3$, N$_2$H$_4$, NH$_4$N$_3$, PH$_3$, P$_2$H$_4$, AsH$_3$, SbH$_3$ and BiH$_3$.

6. The process according to claim 1, wherein said raw material (i) is a member selected from the group consisting of straight chain silanes of the general formula: Si$_n$H$_{2n+2}$ wherein n is an integer of 1 to 8, and cyclic silane of the general formula: Si$_n$H$_{2n+2}$ wherein n is an integer of 3 to 6.

7. The process according to claim 6, wherein the chemical reaction among the raw materials (i), (ii) and (iii) is carried out while the substrate is maintained at a temperature of 200° C. to 900° C.

8. The process according to claim 1, wherein said raw material (i) is a member selected from the group consisting of chain germanes of the general formula: Ge$_m$H$_{2n+2}$ wherein m is an integer of 1 to 5.

9. The process according to claim 8, wherein the chemical reaction among the raw materials (i), (ii) and (iii) is carried out while the substrate is maintained at a temperature of 150° C. to 700° C.

10. A process for preparing an improved valence electron controlled functional epitaxial film on a substrate, comprising the steps of:
   (a) introducing through a first gas transportation conduit into an evacuated film-forming space having said substrate therein; a gaseous raw material (i) containing hydrogen atoms and silicon atoms or germanium atoms;
   (b) separately through a second gas transportation conduit concentric with the first gas transportation conduit, introducing a gaseous material (ii) capable of oxidizing the raw material (i), said gaseous material (ii) comprising F$_2$ gas;
   (c) separately, through a third gas transportation conduit concentric with the first and second gas transportation conduits, introducing a gaseous raw material (iii) capable of imparting a valence electron controlling element;
   (d) providing a mixing and reaction region for said gaseous materials (i), (ii) and (iii) adjacent said film-forming space at outlets of said first, second and third concentric gas transportation conduits;
   (e) mixing and chemically reacting said three gaseous materials (i), (ii) and (iii) in the absence of a plasma and under reduced pressure in said mixing and reaction region surrounding the surface of said substrate while controlling the volume ratio of said gaseous material (i) to said gaseous material (ii) from 1/20 to 100/1, and the volume ratio of said gaseous material (iii) to said gaseous material (i) from 1/1×10$^6$ to 1/10, respectively;
   (f) maintaining said substrate at an elevated temperature to generate a plurality of precursors containing excited precursors and causing at least one of the precursors to form said film;
   (g) subjecting the film being deposited on said substrate to heat treatment by introducing an energy from a source selected from the group consisting of Ar laser, ruby laser, yag laser, excimer laser, electron beam, ion beam, high power lamp and high power electric heater into said film-forming space to promote the formation of said epitaxial film; and (h) maintaining the length between the outlets of said first, second and third concentric gas transportation conduits forming said reaction region and the surface of the substrate from about 5 millimeters to 15 centimeters.

11. The process according to claim 10, wherein said raw material (iii) is a compound containing an element of Group IIIA of the Periodic Table as the constituent.

12. The process according to claim 11, wherein said compound is a member selected from the group consisting of $B_2H_6$, $B_4H_{10}$, $B_5H_9$, $B_5H_{11}$, $B_6H_{10}$, $B_6H_{12}$, $Al(CH_3)_3$, $Al(CH_2H_5)_3$, $Ga(CH_3)_3$, and $In(CH_3)_3$.

13. The process according to claim 10, wherein said raw material (iii) is a compound containing an element of Group VA of the Periodic Table as the constituent.

14. The process according to claim 13, wherein said compound is a member selected from the group consisting of $NH_3$, $HN_3$, $N_2H_5N_3$, $N_2H_4$, $NH_4N_3$, $PH_3$, $P_2H_4$, $AsH_3$, $SbH_3$ and $BiH_3$.

15. The process according to claim 10, wherein said raw material (i) is a member selected from the group consisting of straight chain silanes of the general formula: $Si_nH_{2n+2}$ wherein n is an integer of 1 to 8, and cyclic silane compounds of the general formula: $Si_nH_{2n}$ wherein n is an integer of 3 to 6.

16. The process according to claim 15, wherein the chemical reaction among the raw materials (i), (ii) and (iii) is carried out while the substrate is maintained at a temperature of 200° C. to 900° C.

17. The process according to claim 10, wherein said raw material (i) is a member selected from the group consisting of chain germanes of the general formula: $Ge_mH_{2n+2}$ wherein m is an integer of 1 to 5.

18. The process according to claim 17, wherein the chemical reaction among the raw materials (i), (ii) and (iii) is carried out while the substrate is maintained at a temperature of 150° C. to 700° C.

* * * * *

UNITED STATES PATENT AND TRADEMARK OFFICE
CERTIFICATE OF CORRECTION

PATENT NO. : 4,800,173
DATED : January 24, 1989
INVENTOR(S) : MASAHIRO KANAI, ET AL.

It is certified that error appears in the above-identified patent and that said Letters Patent is hereby corrected as shown below:

ON THE TITLE PAGE,
IN [75] INVENTORS

"Masahiro-Kanai; Junichi Hanna; Isamu Shimizu, all of Tokyo, Japan" should read --Masahiro Kanai, Tokyo; Junichi Hanna; Isamu Shimizu, both of Yokohama, Japan--.

IN [56] REFERENCES CITED

U.S. PATENT DOCUMENTS, "4,239,911  12/1980  Kemlage" should read --4,239,811  12/1980  Kemlage--.

IN [57] ABSTRACT

Line 6, "separtely" should read --separately--.
OTHER PUBLICATIONS, Under Sakai, et al., "687-686." should read 686-687.--.
OTHER PUBLICATIONS, Under Matsumura et al. (first occurrence) "0/1985." should read --10/1985.--.

COLUMN 1

Line 12, "electrophotography" should read --electrophotography,--.
Line 61, "film" should read --film,--.

UNITED STATES PATENT AND TRADEMARK OFFICE
CERTIFICATE OF CORRECTION

PATENT NO. : 4,800,173
DATED : January 24, 1989
INVENTOR(S) : MASAHIRO KANAI, ET AL.

It is certified that error appears in the above-identified patent and that said Letters Patent is hereby corrected as shown below:

COLUMN 2

Line 11, "forcused" should read --focused--.
Line 29, "most" should be deleted.
Line 50, "plane" should read --plain--.

COLUMN 3

Lines 28-9, "devices" should read --device--.

COLUMN 4

Line 12, "expitaxial" should read --epitaxial--.
Line 52, "of being" should read --being--.

COLUMN 5

Line 10, "measure" should read --area--.
Line 50, "In case" should read --In the case--.

COLUMN 6

Line 17, "$Cd(C_{37})_2$," should read --$Cd(C_3H_7)_2$,--.
Line 18, "$Hg[\equiv CC\ C_6H_5)]_2$," should read --$Hg[C\equiv C\ C_6H_5)]_2$,--.
Line 47, "is" should read --are--.

UNITED STATES PATENT AND TRADEMARK OFFICE
CERTIFICATE OF CORRECTION

PATENT NO. : 4,800,173
DATED : January 24, 1989
INVENTOR(S) : MASAHIRO KANAI, ET AL.        Page 3 of 8

It is certified that error appears in the above-identified patent and that said Letters Patent is hereby corrected as shown below:

COLUMN 7

Line 2, "exciter" should read --excited--.
Line 40, "$N_2H_4,NH_4N_3,$" should read --$N_2H_4$, $NH_4N_3$,--.

COLUMN 8

Line 12, "$Sn(t-OC_4H_9)_4,$" should read
--$Sn(t-OC_4H_9)_4$, etc.--.
Lines 55-56, "formed. ¶ It" should read --formed. It--.
Lines 63-64, "Atmospheres" should read --atmospheres--.

COLUMN 9

Line 68, "a" should read --an--.

COLUMN 12

Line 16, "in case" should be deleted.
Line 17, "are now describe" should read --will now be described--.
Line 37, "plate" should read --plate to--.

COLUMN 13

Lines 32-33, "in stead" should read --instead--.
Line 43, "Table 2" should be deleted.

UNITED STATES PATENT AND TRADEMARK OFFICE
CERTIFICATE OF CORRECTION

PATENT NO. : 4,800,173
DATED : January 24, 1989
INVENTOR(S) : MASAHIRO KANAI, ET AL.         Page 4 of 8

It is certified that error appears in the above-identified patent and that said Letters Patent is hereby corrected as shown below:

COLUMN 14

Table 3, Line 18, "9.5 X 10'$^4$" should read --9.5 X 10$^{-4}$--.
Table 3, Line 23, "pm" should read --ppm--.
Line 39, "reulting" should read --resulting--.

COLUMN 15

Line 7, "paralled" should read --parallel--.

COLUMN 16

Line 25, "$H_2H_6$/He" should read --$B_2H_6$/He--.
Table 7, Line 62, "$\sigma_3(S \cdot cm^{-1})$" should read --$\sigma_d(S \cdot cm^{-1})$--.

COLUMN 17

Table 7-continued, Line 4, "$\sigma_3(S \cdot cm^{-1})$" should read --$\sigma_d(S \cdot cm^{-1})$--.

COLUMN 18

Table 10, Line 35, "kind of flow" should read --kind and flow--

COLUMN 20

Line 50, "Series 13-2" should read --Series 13-1--.

UNITED STATES PATENT AND TRADEMARK OFFICE
CERTIFICATE OF CORRECTION

PATENT NO. : 4,800,173
DATED : January 24, 1989
INVENTOR(S) : MASAHIRO KANAI, ET AL.

It is certified that error appears in the above-identified patent and that said Letters Patent is hereby corrected as shown below:

COLUMN 21

Table 13, Line 9, "(cm/V·sec)" should read --(cm$^2$/V·sec)--.
Line 43, "gas was used" should read --gas--.

COLUMN 23

Line 14, "procedure" should read --procedures--.
Line 26, "interval" should read --intervals--.
Line 29, "interval." should read --intervals.--.

COLUMN 24

Table 15, Line 40, "(500 ppm," should read --(5000 ppm,--.

COLUMN 25

Lines 49-50, "in stead" should read --instead--.
Line 53, "babbler" should read --bubbler--.

COLUMN 27

Table 19, Lines 50-51, "PH$_3$ F$_2$He" should read --PH$_3$ F$_2$/He--.

UNITED STATES PATENT AND TRADEMARK OFFICE
CERTIFICATE OF CORRECTION

PATENT NO. : 4,800,173
DATED : January 24, 1989
INVENTOR(S) : MASAHIRO KANAI, ET AL.

Page 6 of 8

It is certified that error appears in the above-identified patent and that said Letters Patent is hereby corrected as shown below:

COLUMN 28

Table 19, Lines 65-66, "3.0 KW  should read -- 3.0 KW
                              10.0 KW                         10.0 KW --.
                              10.0 KW"

COLUMN 30

Line 29, "31-2in" should read --31-2 in--.
    Line 31, "sample" should read --samples--.
    Line 68, "CdSe" should read --CdSe,--.

COLUMN 31

Table 22, Line 19, "32   $Zn(CH_3)_3:Al(CH_3)_3$"
        should read --32   $Zn(CH_3)_2:Al(CH_3)_3$--.

COLUMN 32

Line 10, "being" should read --was--.
    Lines 25-27, "Flash lamp   3.0 KW" should read
        --Flash lamp   3.0 KW
                              8.0 KW --

UNITED STATES PATENT AND TRADEMARK OFFICE
CERTIFICATE OF CORRECTION

PATENT NO. : 4,800,173
DATED     : January 24, 1989
INVENTOR(S) : MASAHIRO KANAI, ET AL.

It is certified that error appears in the above-identified patent and that said Letters Patent is hereby corrected as shown below:

COLUMN 34

Line 12, "AlGaAs" should read --AlGaAs,--.

COLUMN 35

Table 27, Line 5, "film(eU)" should read --film(ev)--.
Line 50, "being" should read --was--.

COLUMN 36

Line 39, "CdSe" should read --CdSe,--.
Table 29, Line 58, "Zn(CH):Al(CH) = $10^4$:1/He" should read --Zn($CH_3$)$_2$:Al($CH_3$)$_3$ = $10^4$:1/He--.

UNITED STATES PATENT AND TRADEMARK OFFICE
CERTIFICATE OF CORRECTION

PATENT NO. : 4,800,173
DATED : January 24, 1989
INVENTOR(S) : MASAHIRO KANAI, ET AL.　　Page 8 of 8

It is certified that error appears in the above-identified patent and that said Letters Patent is hereby corrected as shown below:

COLUMN 38

Line 9, "$N_2H_4, NH_4N_3,$" should read --$N_2H_4, NH_4N_3,$--.

Signed and Sealed this

Twentieth Day of August, 1991

Attest:

HARRY F. MANBECK, JR.

Attesting Officer　　Commissioner of Patents and Trademarks